(12) United States Patent
Barringer et al.

(10) Patent No.: US 6,198,525 B1
(45) Date of Patent: Mar. 6, 2001

(54) SYSTEM FOR CONTACT IMAGING BOTH SIDES OF A SUBSTRATE

(75) Inventors: Wayne Albert Barringer, Boca Raton; Guenter Schaefer, Fort Lauderdale, both of FL (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/253,673

(22) Filed: Feb. 19, 1999

(51) Int. Cl.[7] .................................................. G03B 27/32
(52) U.S. Cl. ................................. 355/23; 355/26; 355/53
(58) Field of Search .................................. 355/23, 26, 53

(56) References Cited

U.S. PATENT DOCUMENTS

| | | | |
|---|---|---|---|
| 4,325,077 | * 4/1982 | Dunham | 358/107 |
| 4,538,906 | * 9/1985 | Brown | 355/14 |
| 4,579,446 | * 4/1986 | Fujino et al. | 355/24 |
| 4,677,301 | 6/1987 | Tanimoto et al. | 250/548 |
| 4,742,376 | 5/1988 | Phillips | 355/77 |
| 4,898,804 | 2/1990 | Rauschenbach et al. | 430/311 |
| 4,924,257 | 5/1990 | Jain | 355/53 |
| 5,021,821 | 6/1991 | Suzuki | 355/53 |
| 5,285,236 | 2/1994 | Jain | 355/53 |
| 5,298,939 | 3/1994 | Swanson et al. | 355/53 |
| 5,394,222 | * 2/1995 | Genovese | 355/208 |
| 5,548,372 | 8/1996 | Schroeder et al. | 355/53 |
| 5,652,645 | 7/1997 | Jain | 355/53 |
| 5,721,606 | * 2/1998 | Jain | 355/53 |

* cited by examiner

*Primary Examiner*—Safet Metjahic
*Assistant Examiner*—Etienne LeRoux
(74) *Attorney, Agent, or Firm*—Ronald V. Davidge; Richard A. Tomlin

(57) ABSTRACT

Apparatus for contact exposing each side of a substrate to a different image on a mask includes a first-side imaging station for imaging the first side of the substrate, a second-side imaging station for imaging the second side thereof, an intermediate station between the imaging stations for inverting the substrate. In each imaging station, the substrate is moved longitudinally with a transport carriage, from which it is transferred to an imaging carriage to be driven to an imaging point at which illumination through the mask occurs. The imaging carriage moves in both longitudinal and transverse directions, providing for both exposure to a mask covering the substrate and for step-and-repeat exposure of multiple portions of the substrate to a smaller image. Before exposure, the top surface of the substrate is aligned to be parallel to the adjacent mask, fiducial markings in the substrate are aligned with fiducial markings on the mask, and air is evacuated from the area between the mask and the substrate.

14 Claims, 12 Drawing Sheets

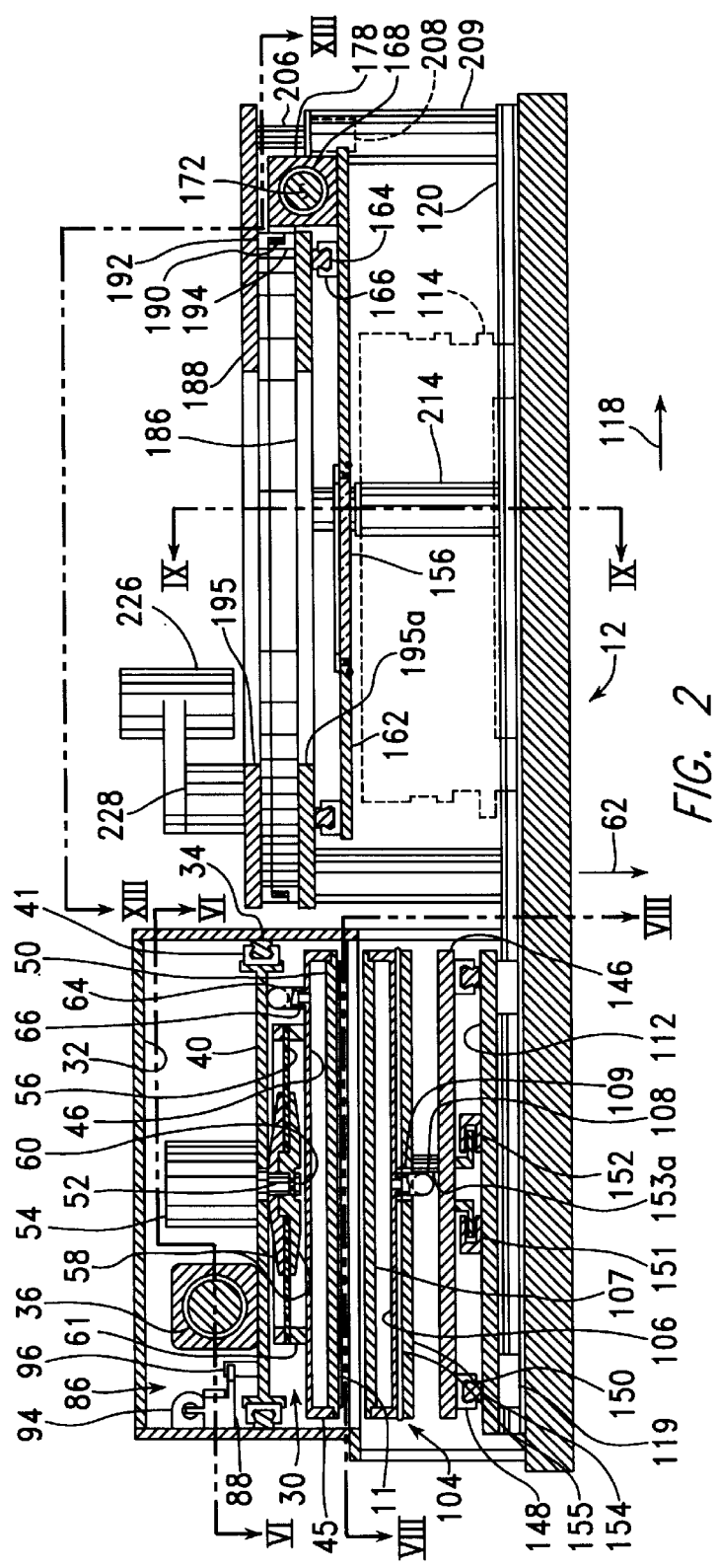
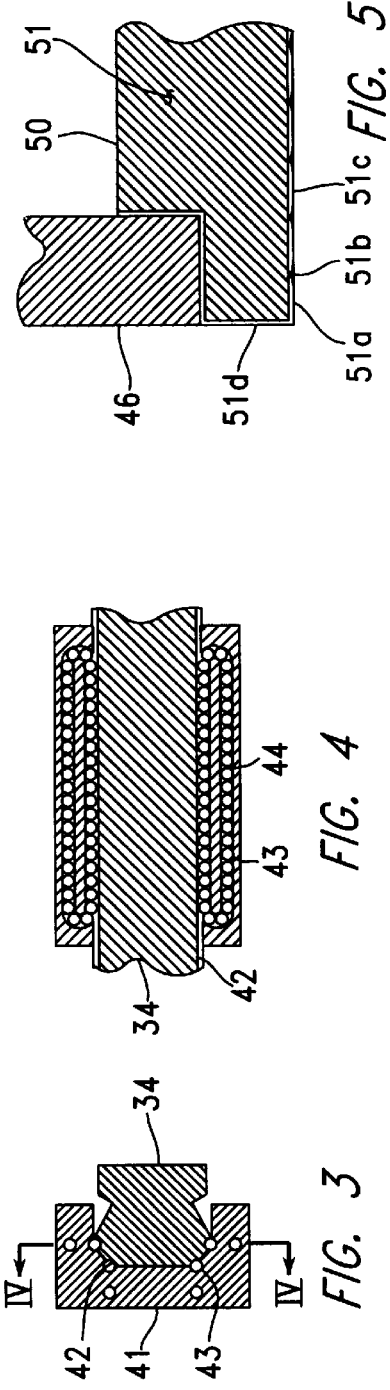

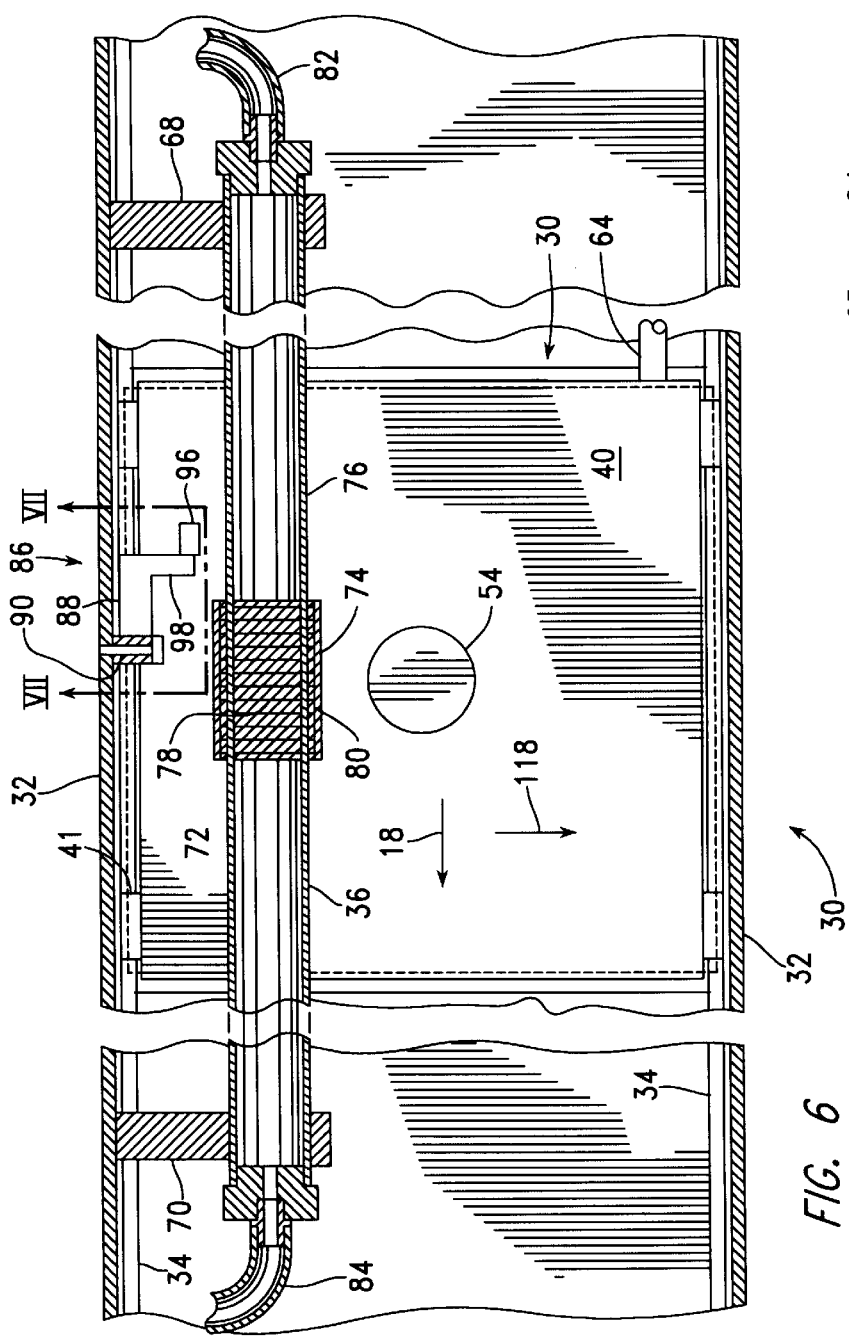
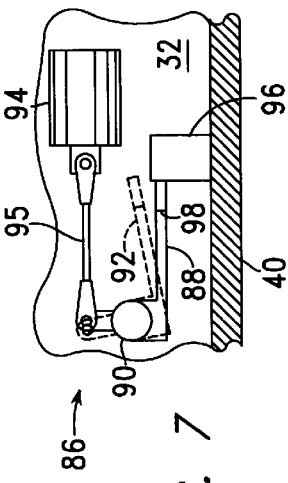
FIG. 6
FIG. 7

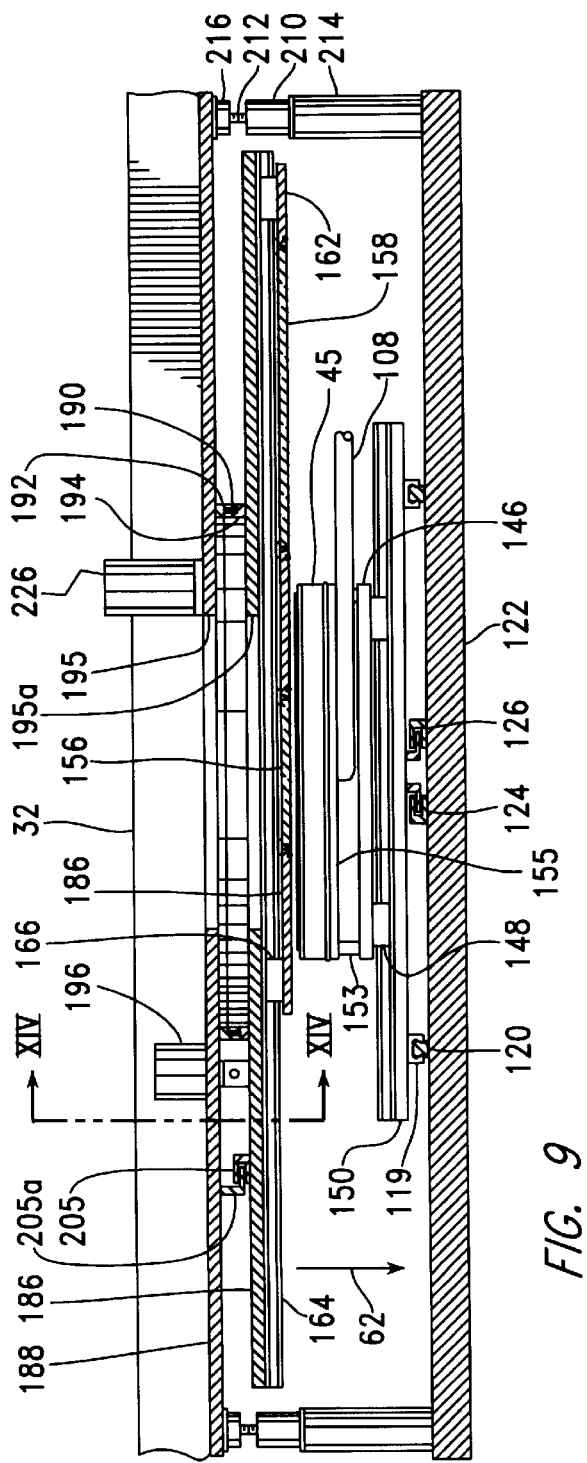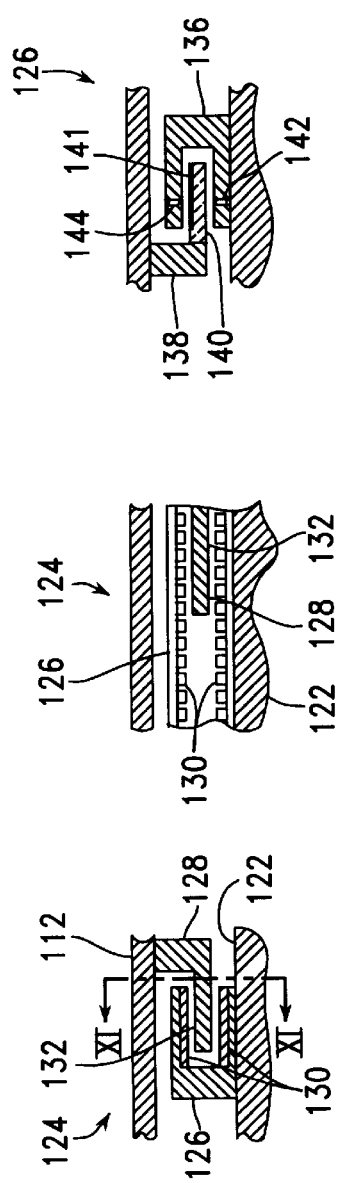

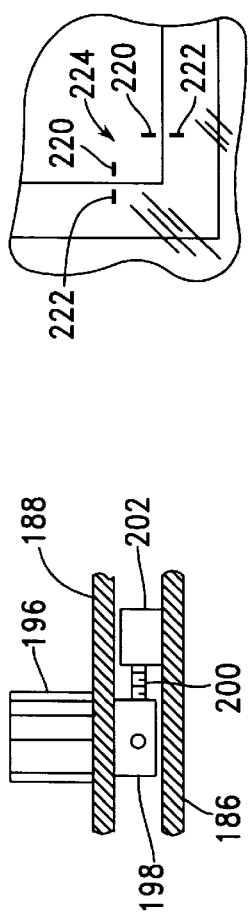
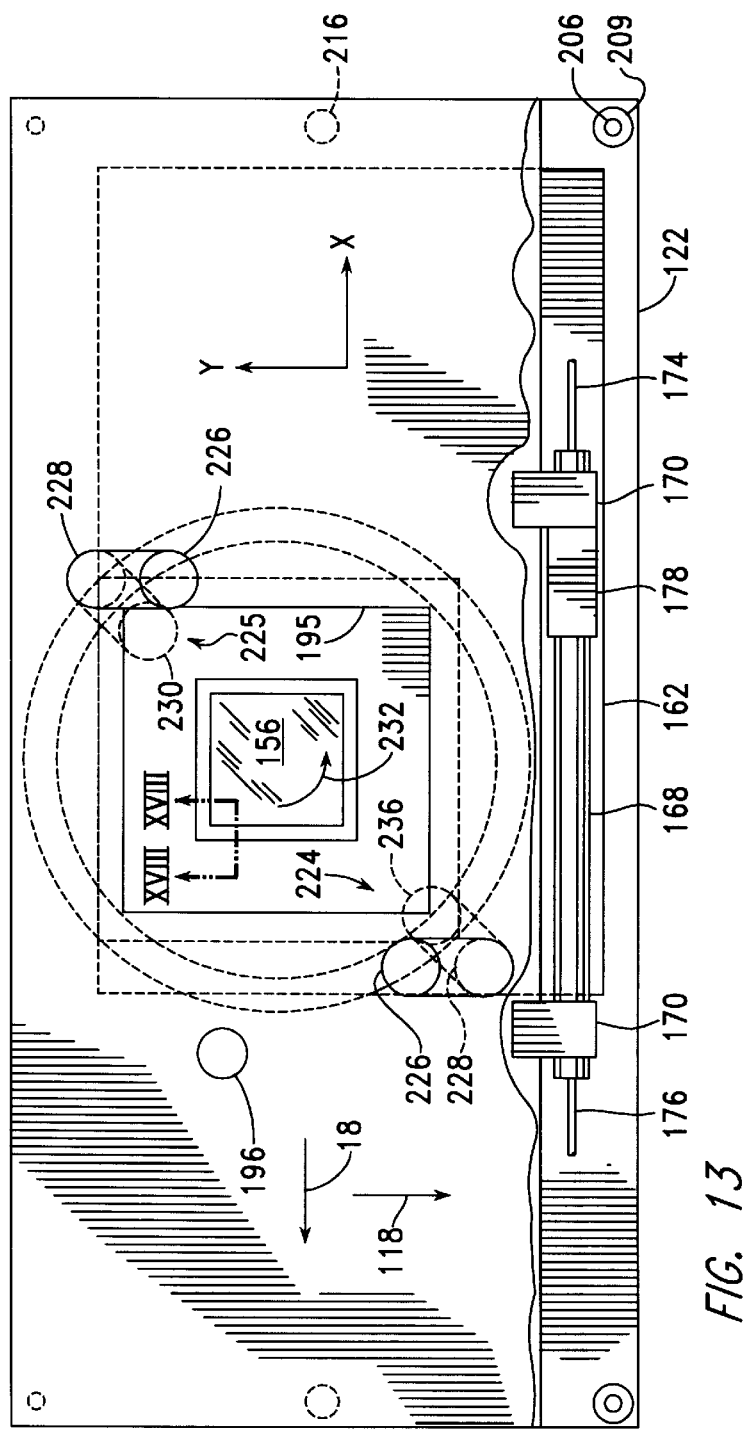
FIG. 14
FIG. 15
FIG. 13

SYSTEM FOR CONTACT IMAGING BOTH SIDES OF A SUBSTRATE

FIELD OF THE INVENTION

This invention relates to apparatus for performing contact imaging on flexible substrates, and, more particularly, to such apparatus having an ability to image both major sides of the substrate while providing a capability for step-and-repeat processing.

BACKGROUND OF THE INVENTION

A conventional step in the manufacture of a printed circuit board is optically imaging a pattern representative of the circuit to be printed onto the surface of the board, which has been coated with a photosensitive material. The photosensitive material is then processed to produce conductive circuit traces forming the circuit. The imaging process may be a contact imaging process, in which light from a powerful illumination source is directed to shine through a glass mask having a pattern defining the image to be formed on the substrate. This pattern is held close to the substrate surface being imaged. Step-and-repeat contact imaging is used to produce substrates having a number of identical circuits, each of which is much smaller than the substrate, with imaging and subsequent chemical processing occurring before the substrate is cut into individual segments, by sequentially illuminating the substrate through a mask which is stepped through an array of imaging positions. The imaging process may alternately be a projection imaging process, in which light transmitted through the mask including the pattern to be imaged is focused on the substrate through a projection lens system. A number of U.S. patents describe apparatus for this process of imaging a pattern without achieving capabilities to image both sides of a flexible substrate in a high-speed, flexible process forming high-density circuit patterns, which are of particular interest today.

For example, U.S. Pat. No. 5,548,372 to Schroeder et al describes contact imaging apparatus designed to provide accurately aligned printed circuits on both major sides of a printed circuit board layer. The apparatus includes patterns formed on glass masks attached to frames incorporating alignment pins and slots. The patterns include registration marks for alignment during the manufacture of the apparatus. During use, the apparatus allows accurate alignment of patterns on both sides of a PCB (printed circuit board) layer. Also disclosed is the apparatus with buttons used to pattern PCB layers having pre-drilled Z-axis holes. Thus, while this apparatus provides a method for aligning a mask on each side of the PCB board, the reliance on pins and holes for alignment is detrimental to using the apparatus in an automated imaging tool to produce PCB boards having the accuracy required for the presently significant high-density circuits. Thus, what is needed is tooling apparatus producing accurate alignment of the various element without using pins in holes, together with methods for handling flexible substrates, for changing the masks to produce different types of circuits, and for step and repeat imaging.

U.S. Pat. Nos. 4,924,257, 5,285,236, and 5,652,645, each to Jain, describe large image projection systems having large area exposure capability, in which an image from a moving mask is focused onto a substrate moving in a complementary fashion. Both the mask and the substrate move either in a scanning direction producing the image as an elongated strip, or in a lateral direction perpendicular to the scanning direction, so that the next strip of image can be produced with a subsequent scanning motion. A light source illuminating the mask is arranged to produce a light pattern having a hexagonal shape. Adjacent image strips overlap one another, with overlapping areas being illuminated by triangular portions of the hexagonal pattern, so that a uniform level of illumination is achieved. In the device U.S. Pat. No. 4,924,257, the mask and substrate move in opposite directions on opposite sides of the focusing lens, which is positioned to magnify the image from the mask. The mask is moved at a velocity greater than that of the substrate. In the devices of U.S. Pat. Nos. 5,285,236 and 5,652,645, the mask and substrate are both placed on an upper surface of a movable stage, with the mask being illuminated from below, and with the image being reflected from a steering mirror and transmitted through an objective lens providing a unity magnification and a reversing means rendering the image in the same orientation as the object. In the device of U.S. Pat. No. 5,285,236 are each essentially the same size. In the device of U.S. Pat. No. 5,652,645, the substrate is an elongated flexible strip, on which a number of images of the mask are placed. Provisions are made to move the strip in both longitudinal and transverse directions, as required by the imaging process.

U.S. Pat. No. 5,298,939 to Swanson et al. describes a scanning projection system for transferring an image from a stationary mask onto a stationary substrate by means of a moving optical system including a light source and a number of prisms, lens elements, and mirrors.

U.S. Pat. Nos. 4,667,301 to Tanimoto et al and 4,742,376 to Phillips describe step-and-repeat alignment and projection exposure systems for printing an image of a mask onto a semiconductive wafer. The system of U.S. Pat. No. 4,667,301 has a projection optical system for projecting a pattern image on a mask onto a substrate, a detector for detecting a two-dimensional misalignment of a projected pattern image and the substrate, and means for moving the substrate along orthogonal x- and y-axis directions and for rotating the substrate along a rotational direction within a plane defined by the x- and y-axis directions to eliminate the misalignment. The system of U.S. Pat. No. 4,742,376 uses a catadioptric lens having a unity magnification, which views an image of a mask through a prism, and which exposes a portion of the wafer through a beamsplitter. For alignment, stage reference means image a stage reference mark into the image plane of the lens when the stage reference means are illuminated by the projected mask image. A six-degree of freedom support system is controlled by focusing and leveling means to provide vertical position, pitch, and roll movement of the wafer being imaged.

SUMMARY OF THE INVENTION

In accordance with a first aspect of the present invention, there is provided apparatus for contact exposing a first side of a substrate to illumination through a first mask and for contact exposing a second side of the substrate to illumination through a second mask. The apparatus includes a first-side exposure station for exposing the first side of the substrate, a second-side exposure for exposing the second side of the substrate, and an intermediate station receiving the substrate from the output position of the first-side exposure and supplying the substrate to the input position of the second-side exposure station. The first-side exposure station includes an input tray for introducing the substrate into the first-side exposure station, a first transport carriage moving the substrate through the first-side exposure station in a longitudinal direction, a first illumination source illuminating the first side of the substrate through the first mask in a first imaging position, a first mask support plate holding the first mask in the first imaging position, a first imaging carriage moving the substrate between the first transport carriage and the first imaging position, and an output position to which the first substrate is moved by the transport carriage after exposure to the illumination source in the imaging position. The second-side exposure station includes an input position for introducing the substrate into the second-side exposure station, a second transport carriage moving the substrate through the second-side exposure station in a longitudinal direction, a second illumination source illuminating the second side of the substrate through the second mask in a second imaging position, a second mask support plate holding the second mask in the second imaging position, a second imaging carriage moving the substrate between the second transport carriage and the second imaging position, and an output tray to which the second substrate is moved by the second transport carriage after exposure to the illumination source in the second imaging position. The intermediate station includes a flipping member inverting the substrate.

In an imaging system built in accordance with the present invention, a movable transport vacuum platen within a first-side imaging station picks up a flexible substrate from an input tray and places it on a movable imaging vacuum chuck attached to a precision X-Y stage. A glass mask is then moved to a very small distance, such as 25 microns (0.001 inch), above the surface of the flexible substrate. Two through-beam laser systems with associated piezoelectric actuators ensure parallelism between the glass mask and the substrate to a level of 6 microns (0.00024 inch). The substrate is then aligned to the mask in an X-Y plane through the use of a vision system, with an X-Y positioner translating the substrate while the mask is rotated about an axis perpendicular to the X-Y plane. An inflatable bellows then forces the mask and the substrate together, as a vacuum is drawn within the space between the mask and substrate to expel trapped air. A flexible sealing member enables the vacuum to be drawn as the mask and substrate approach one another. Next, a high-energy UV (ultraviolet) light source exposes the substrate through the mask. After a required dwell time, the product and the mask are separated with the assistance of nitrogen purge apparatus.

Next, a movable imaging vacuum chuck returns the imaged substrate from the imaging position, in which it has been exposed, to the movable transport vacuum platen, which in turn transports the substrate to a flipping mechanism. The flipping mechanism rotates the substrate about an axis parallel to the xy plane through an angle of 180 degrees, placing the previously-imaged side face down. The substrate is now in position to be handled within a by a second vacuum transport platen for placement onto a second imaging vacuum chuck attached to a second X-Y stage. The procedure described above is now repeated in a second exposure station, so that the unexposed side of the substrate is exposed. Next, the second vacuum platen places the completed product into an output tray. Interleafs are easily handled at both the input and output trays by the associated vacuum platens.

The operations described above are synchronized to enable continuous processing of substrates through the imaging system in an automatic manner. Manual loading and unloading of the substrates is eliminated. Substrates are loaded and unloaded simultaneously at both the first and second imaging stations. Step-and-repeat processing is available at each imaging station, and the two imaging stations may be operated independently if one station fails, or if it is desirable to process two different products at the same time.

BRIEF DESCRIPTION OF THE DRAWINGS

FIG. 2 is a fragmentary transverse cross-sectional view of a first-side imaging station within the automated imaging system of FIG. 1, taken as indicated by section lines II—II in FIG. 1, to show imaging carriage apparatus used to move a substrate into and out of the process of UV exposure;

FIG. 3 is a transverse cross-sectional view of a bearing and an associated rail used to provide for sliding motion in a number of instances within the first-side imaging station of FIG. 2;

FIG. 4 is a longitudinal cross-sectional view of the bearing of FIG. 3, taken as indicated by section lines VI—VI in FIG. 5 to indicate provisions made for the recirculation of load-bearing balls within the bearing;

FIG. 5 is a fragmentary vertical cross-sectional view of a vacuum platen in the first-side imaging station of FIG. 2, showing details of its construction;

FIG. 6 is a fragmentary cross-sectional plan view, taken as indicated by section lines VI—VI in FIG. 2, to show a transport carriage and associated drive means used to carry the substrate in a longitudinal direction to and from the imaging carriage apparatus of FIG. 2;

FIG. 7 is a longitudinal cross-sectional view taken as shown by section lines VI—VI in FIG. 6 to show a removable stop mechanism, within the drive means of FIG. 6, used to stop the transport carriage in a central position for transferring the substrate to or from the imaging carriage apparatus of FIG. 2;

FIG. 9 is a fragmentary vertical cross-sectional view of the imaging carriage apparatus of FIG. 2, taken as indicated by section lines IX—IX therein;

FIG. 10 is a transverse cross-sectional view of a linear motor used to provide linear motion in a number of instances within the first-side imaging station of FIG. 2;

FIG. 11 is a longitudinal view of the motor of FIG. 10, taken as indicated by section lines XI—XI therein;

FIG. 12 is a transverse cross-sectional view of a position transducer used to provide and measure linear motion in a number of instances within the first-side imaging station of FIG. 2;

FIG. 13 is a fragmentary cross-sectional plan view of the first-side imaging station of FIG. 2, taken as indicated by section lines XIII—XIII therein to show means for moving a shuttle plate holding masks and means to view fiducial markings used for alignment;

FIG. 14 is a fragmentary vertical cross-sectional view of a portion of the mask moving apparatus of FIG. 13, taken as indicated by section lines XIV—XIV therein;

FIG. 15 is a fragmentary plan view of a mask within the mask moving apparatus of FIG. 13, showing fiducial markings used to align the mask with an underlying substrate;

DETAILED DESCRIPTION OF THE INVENTION

Figure 1:
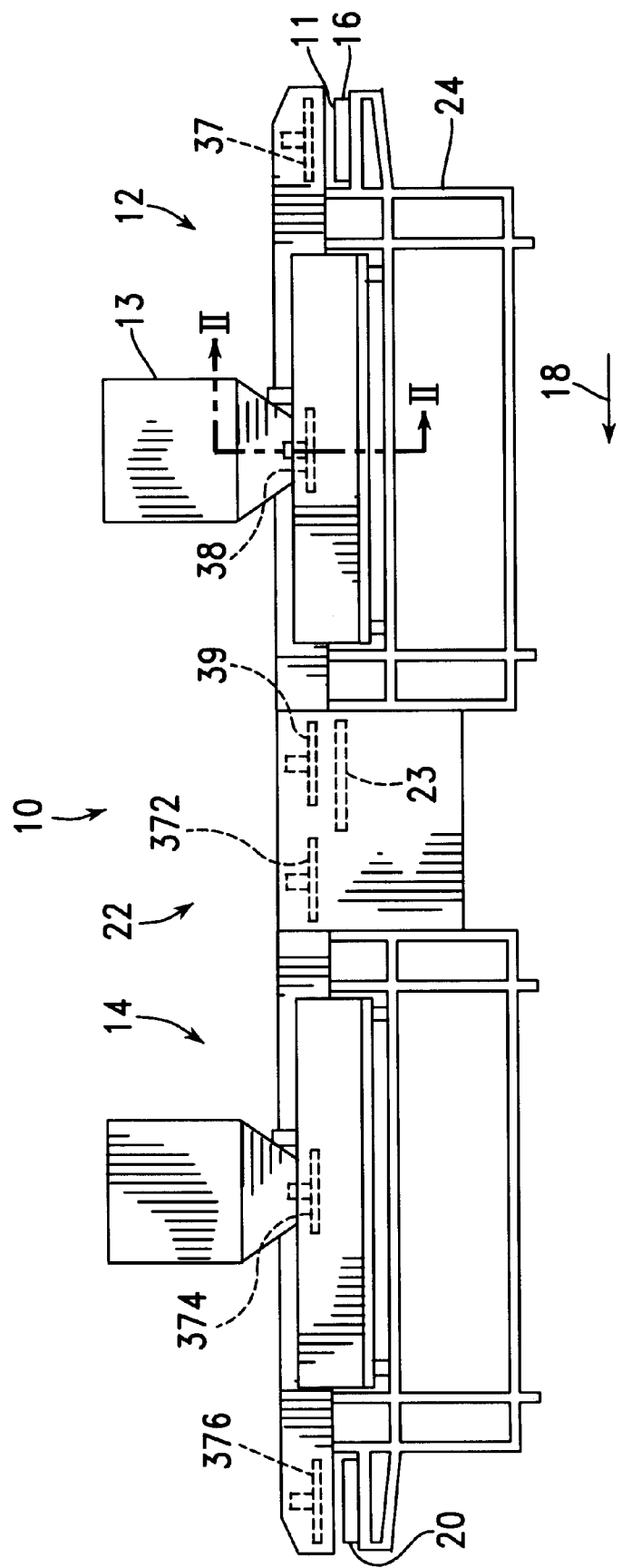
FIG. 1 is a side elevation of an automated imaging system built in accordance with the present invention.

FIG. 1 is a side elevation of an automated imaging system 10 built in accordance with the present invention for imaging both sides of a substrate 11. This system 10 includes a first-side imaging station 12, for exposing the first side of the substrate 11 to a UV exposure lamp 13, and a second-side imaging station 14, for similarly exposing the second side of the substrate 11. Individual substrates 11 are removed from an input tray 16 including a stack of substrates, moved through the system 10 in the longitudinal direction of arrow 18, and collected in a stack of substrates within an output tray 20. As each substrate 11 is moved between the first-side imaging station 12 and the second-side imaging station 14, it is inverted within an intermediate station 22 by means of a pivoting carrier 23. Each imaging station 12, 14 is constructed on its own floor-standing framework 24 in a modular fashion.

FIG. 2 is a fragmentary transverse cross-sectional view of the first-side imaging station 12 within the automated imaging system 10 of FIG. 1, taken as indicated by section lines II—II in FIG. 1 to show apparatus used to move a substrate 11 through the imaging process.

Referring to FIGS. 1 and 2, each substrate 11 is moved through the first-side imaging station 12 in the longitudinal direction of arrow 18 by means of a transport carriage 30, which moves within a longitudinally-extending channel 32 along rails 34, in and opposite to the direction of arrow 18, being driven by a rodless pneumatic cylinder 36. Specifically, the in the first side imaging station 12, a single transport carriage 30 is moved from a first position, as indicated in FIG. 1 by dashed lines 37, in which a single substrate 11 is picked up from the input tray 16, to a central position, as indicated by dashed lines 38, from which the substrate 11 is moved through the imaging process, and hence to a third position, as indicated by dashed lines 39, in which the substrate 11 is deposited within the intermediate station 22. The transport carriage 30 includes a carriage plate 40 which is provided with four bearings 41 providing for sliding motion of the transport carriage 30 along the rails 34.

FIG. 3 is a transverse cross-sectional view of one of these bearings 41 in engagement with a rail 34, while FIG. 4 is a longitudinal cross-sectional view taken as indicated by section lines IV—IV in FIG. 3. The rail includes a number of grooves 42 in which load-bearing balls 43 roll. These balls 43 also roll within paths 44 of the bearing 34, which provide for the circulation of rolling balls 43 as the bearing 34 is moved along the rail 34. In this way, rolling contact is maintained. Bearings and rails of this general type are available from THK Co., Ltd. of Tokyo, Japan.

Referring again to FIG. 2, the substrate 11 is held on the transport carriage 30 by means of a transport vacuum chuck 45 displaced below the carriage plate 40. The transport vacuum chuck 45 includes a plenum chamber 46 with a downward-facing plenum opening and a transport platen 50 extending across the plenum opening.

FIG. 5 is a fragmentary vertical cross-sectional view of the transport platen 50. A core layer 51 is formed of porous aluminum, having a porous and fibrous structure with open air spaces through which a vacuum is drawn. The outer surface of the transport platen 50 is formed by a thin metal sheet 51a, which is bonded to the core layer 51. The metal sheet 51a includes an array of holes 51b formed by a drill point to be enlarged at the outer surface 51c, so that effective area to which a vacuum is applied is increased. The outer surface 51c is preferably rubberized to improve adhesion with the substrates 11 being handled by the transport platen 50. Sideplates 51d, which may be separate pieces or formed portions of the metal sheet 51a, prevent airflow through the sides of the transport platen 50.

Referring again to FIG. 2, the transport vacuum chuck 45 is resiliently mounted to an output shaft 52 of a linear actuator 54 by means of a flexible plate 56, which is composed, for example, of an elastomeric material. A central portion of the flexible plate 56 is clamped on the output shaft 52 between two opposing hubs 58 by a screw 60 extending downward from the output shaft 52. A peripheral portion of the flexible plate 56 is clamped at a ridge 61 extending upward from the plenum chamber 46. The linear actuator 54 is used to hold the transport vacuum chuck 45 upward for movement within the longitudinally-extending channel 32, and alternately to move the transport vacuum chuck 45 downward, in the direction of arrow 62, to pick up or place the substrate 11. The transport plenum 46 is evacuated to pick up a substrate 11 lying adjacent the transport platen 50, and is subsequently pressurized to release the substrate 11, through a hose 64 fastened onto a coupling 66 extending upward from the transport plenum 46.

FIG. 6 is a cross-sectional plan view of taken as indicated by section lines VI—VI in FIG. 2 to show the mechanisms used to move the transport carriage 30 in, and opposite to, the longitudinal direction of arrow 18 along the rails 34. These mechanisms include a rodless cylinder 36 fastened within the longitudinally-extending channel 32 by means of a right mounting post 68 and a left mounting post 70. A piston 72 slides within the rodless cylinder 36, while a driven block 74 slides on the external surface 76 of the rodless cylinder 36. The piston 72 includes a magnetic structure 78 composed of permanent magnetic materials, and the driven block 74 includes a corresponding magnetic structure 80, also composed of permanent magnetic materials, which is attracted to the magnetic structure 72 in a manner ensuring the movement of the driven block 74 with the piston 72. The driven block 74 is attached to the transport plate 40 so that the transport carriage 30 moves in and opposite to the direction of arrow 18 in response to similar movement of the piston 72.

Thus, the transport carriage 30 is moved in the direction of arrow 18 by pumping air into the rodless cylinder 36 through a first hose 82 and by allowing air to escape through a second hose 84. Similarly, the transport carriage 30 is moved opposite to the direction of arrow 18 by pumping air into the rodless cylinder 36 through the second hose 84 and by allowing air to escape through the first hose 82. Air pressure is also used to hold the transport carriage 30 against a stopping surface. For example, the driven block 74 is held against the right mounting post 68 by the application of air pressure through the second hose 84 and against the left mounting post 70 by the application of air pressure through the first hose 82.

Continuing to refer to FIG. 6, and referring again to FIGS. 1 and 2, the movement of the substrate 11 through the first-side imaging station 12 begins with the transport carriage 30 in the position indicated by dashed lines 37, and with the driven block 74 held against the right mounting post 68. After the transport vacuum chuck 45 is moved downward, by means of the actuator 54, on top of the supply stack 16 of substrates 11, a vacuum is established within the plenum 46, so that the uppermost substrate 11 is held in contact with the transport plenum 50. The transport vacuum chuck 45 is then moved upward by means of the actuator 54, and the transport carriage 30 is moved from the position indicated by dashed lines 37 to the central position indicated by dashed lines 38.

FIG. 7 is a longitudinal cross-sectional view taken as shown by section lines VII—VII in FIG. 6 to show a removable stop mechanism 86 used to stop the transport carriage 30 in the central position indicated by dashed lines 38. This stop mechanism 86 includes a crank 88 rotatably mounted on a pin 90 extending within the longitudinally-extending channel 32. The crank 88 is pivoted between the lower position in which it is shown and an upper position, in which it is indicated by dashed lines 92, by means of a linear actuator 94 attached to the crank 88 through a link 95. The actuator 94 may be a pneumatic cylinder, double acting or single acting with a return spring, or a solenoid.

When the crank 88 is in the lower position in which it is shown, it stops movement of the transport carriage 30 as a stopping post 98, attached to carriage plate 40 of the transport carriage 30, is brought into contact with a tab 98 extending inward as a part of the crank 88. When the crank 88 is pivoted into the upper position indicated by dashed lines 92, the stopping post 98 is released so that the transport carriage 30 can continue movement in the direction of arrow 18.

Figure 8:
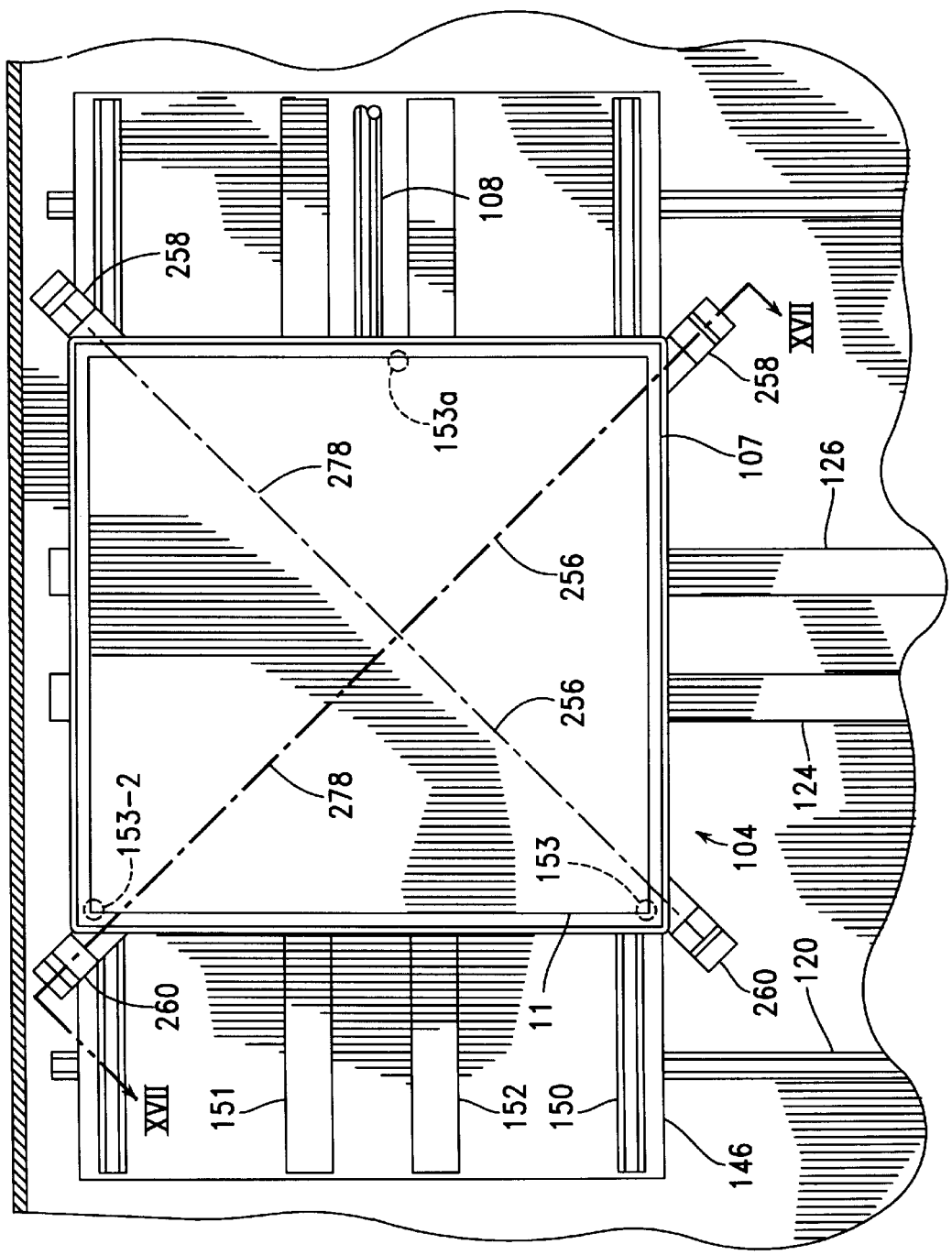
FIG. 8 is a fragmentary cross-sectional plan view of the imaging carriage apparatus of FIG. 2, taken as indicated by section lines VIII—VIII therein.

FIG. 8 is a cross-sectional plan view taken as shown by section lines VIII—VIII in FIG. 2, showing the apparatus used to move the substrate 11 through the imaging process.

Referring to FIGS. 2 and 8, the substrate 11 is carried through the first-side imaging process while being held in place atop an imaging vacuum chuck 104, which includes a vacuum plenum chamber 106 having an upward-facing opening across which an imaging platen 107 extends. The imaging platen 107 is built as described above in reference to FIG. 5, except that it does not have a rubberized outer surface, so that the application of a vacuum within the plenum chamber 106 causes a substrate 11 placed atop the vacuum chuck 104 to be held rigidly in place. The plenum chamber 106 is evacuated for the attachment of a substrate 11 to the imaging platen 107, and is subsequently pressurized for the release of the substrate 11 from the imaging platen 107 through a hose 108 attached to a coupling 109 extending downward from the plenum chamber 106.

Referring to FIGS. 1, 6, and 7, the substrate 11 is transferred between the transport carriage 30 and the imaging vacuum chuck 104 with the transport carriage 30 held in a central position, as indicated by dashed lines 38 in FIG. 1, atop the vacuum chuck 104. The transport carriage 30 is moved into this position in the direction of arrow 18 by the application of pressurized air through the first hose 82, with the crank 88 held in its lower position to contact the stopping post 98 of the transport carriage 30. This position of the transport carriage 30 is subsequently held by maintaining the crank 88 in its lower position and by maintaining air pressure within the hose 82.

FIG. 9 is a fragmentary vertical cross-sectional view taken as shown by section lines IX—IX in FIG. 2.

In FIGS. 2, 8, and 9, the imaging vacuum chuck 104 is shown in position to receive the substrate 11 from the transport carriage 30. This transfer is accomplished by first moving the transport vacuum chuck 45 downward, in the direction of arrow 62 by means of linear actuator 54 until the substrate 11 is brought into contact with the imaging vacuum chuck 104, with a vacuum continuing to be applied to the vacuum chamber 46. Next, the vacuum plenum chamber 106 is evacuated, and air is returned to the vacuum chamber 46 within the transport vacuum chuck 45, completing the process of transferring the substrate 11 from the transport carriage 30 to the imaging vacuum chuck 104. The transport vacuum chuck 45 is next moved upward to provide clearance for the movement of a lower carriage 112 carrying the imaging vacuum chuck 104 from the position in which it is shown to the position indicated by dashed lines 114 in FIG. 2. With the lower carriage in the position indicated as an outline by dashed lines 114, the imaging vacuum chuck 104 is placed in a central position for imaging at an imaging station 116. The lower carriage 112 is further moved in increments in the direction of arrow 118 and opposite thereto to effect step and repeat imaging in the direction of arrow 118.

Bearings 119, which are part of the lower carriage 112, move along lower carriage rails 120, which are fastened to a baseplate 122. The bearings 119 and rails 120 are, for example, configured as described above in reference to FIGS. 4 and 5. The baseplate 122 may be composed of granite. In a preferred version on the present invention, the lower carriage 112 is moved through a stroke of 96.5 cm (38 inches) by means of a linear motor 124, with the resulting motion being tracked by means of a linear transducer 126.

FIG. 10 is a transverse cross-sectional view of the linear motor 124, and FIG. 11 is a longitudinal cross-sectional view of the motor 124, being taken as indicated by section lines XI—XI in FIG. 10. The linear motor 124 includes a magnet track assembly 126 attached to the baseplate 122 and a coil assembly 128 attached to the lower carriage 112. The magnet track assembly 126 includes two rows of permanent magnets 130, arranged in alternating directions of polarization. The coil assembly 128 includes three motor windings extending with an insulating block 132, which moves between the two rows of permanent magnets 130. An interaction between electrical current driven into the motor windings and the magnetic fields of the magnets causes movement of the lower carriage 112. Linear motors of this type are supplied by the Trilogy Systems Corporation of Webster, Tex.

FIG. 12 is a transverse cross-sectional view of the linear transducer 126, which includes an instrumentation channel 136 fastened to the baseplate 122 and a scale assembly 138 fastened to the lower carriage 112. The scale assembly 138 includes a transparent portion 140 with a longitudinally-extending row of indicia 141. The instrumentation channel 136 includes an illumination source 142, such as an LED, and a photodetector 144, which is alternately exposed light from the illumination source 142 and masked therefrom by the indicia 141 of the transparent portion. Thus, the actual position of the lower carriage 112 is determined by counting pulses in the output of the photodetector 144. Transducers of this type are supplied by RSF Elektronik of Rancho Cordova, Calif.

Referring again to FIGS. 2 and 9, an upper carriage 146, extending between the lower carriage 112 and the imaging vacuum chuck 104 is moved in and opposite the direction of arrow 118 to perform the movement of the imaging vacuum chuck in increments for step and repeat imaging in the direction of arrow 118. The upper carriage 146 is moved on the lower carriage 112, with bearings 148 engaging rails 150. The imaging vacuum chuck 104 is attached atop the upper carriage 146. In a preferred version of the present invention, the upper carriage travels through a total distance of 45.7 cm (18 inches) by means of a linear motor 151, as movements are measured by a linear transducer 152. The linear motor 151 and linear transducer 152 are configured, for example, as described above in reference to FIGS. 10–12. The imaging vacuum chuck 104 is mounted to the upper carriage 146 through two piezoelectric actuators 153, which independently extend and contract vertically as required to level a substrate 11 placed on the imaging vacuum chuck 104, and by a post 153a, which provides a constant-height point about which the imaging vacuum chuck 104 pivots with the expansion and contraction of the actuators 153a. These actuators 153 and post 153a are attached to a mounting plate 154, with an inflatable bellows 155 extending between the mounting plate 154 and the plenum chamber 106 of the vacuum chuck 104. The bellows 155 is used to provide vertical positioning and cushion the vacuum chuck 104.

In this way, a preferred version of the present invention is configured to handle a substrate can be as large as a square having sides 35.6 cm (14 inches) long, with a square central portion of such a substrate, having sides 30.5 cm (12 inches) in length, being imaged with step and repeat imaging through four steps in each direction. Under these conditions, imaging occurs through a glass master, used as a mask, shaped as a square having sides 7.62 cm (3 inches) in length. Carriage drive systems, including controllers and linear motors of the kind described above for driving the upper and lower carriages 146, 112 have been developed with a capability of moving 2.54 cm (1 inch) in 125 milliseconds, while providing a repeatability within ±0.5 microns.

The imaging process occurs as the substrate 11, being held in place atop the imaging vacuum chuck 104, is illuminated through a master in the form of a step and repeat glass master 156 or through a full size glass master 158. Each of these glass masters is 3.17 mm (0.125 inch) thick. Illumination for the imaging process is provided by a UV lamp 13, which is, for example, a TAMARACK 2000-watt light source. In a preferred version of the present invention, the full size glass master 158 accommodates a square image pattern with sides having a length of 30.5 cm (12 inches), while the step and repeat glass master 156 is square, having sides with a length of 17.8 cm (7 inches). Thus, depending on the size of the area being imaged with each step of the step and repeat process, the full image area of substrate 11 can be imaged by the step and repeat process with as few as four alignments of the substrate 11 or with as many as sixteen alignments of the substrate 11. The two glass masters 156, 158 are adhesively bonded to a shuttle plate 162, which is driven between the position in which it is shown, with the step and repeat glass master 156 being centrally positioned within the imaging station 76, and a position in which the full size glass master 158 is centrally positioned within the imaging station 76. The shuttle plate 162 moves in and opposite to the direction of arrow 18 on a pair of rails 164, engaging bearings 166, being driven by a rodless cylinder 168.

FIG. 13 is a cross-sectional plan view of the first side imaging station 10, taken as indicated by section lines XIII—XIII in FIG. 2. Referring to FIGS. 2 and 13, the rodless cylinder 168 is similar in operation to the rodless cylinder 36, which has been described above in reference to FIGS. 2 and 6. Thus, the rodless cylinder 168 is attached to extend between a pair of support blocks 170. A piston 172 slides within the cylinder 168, moving in the direction of arrow 18 when air is admitted under pressure to the cylinder 168 through a first hose 174 and exhausted from the cylinder 168 through a second hose 176, and moving opposite the direction of arrow 18 when air is admitted under pressure to the cylinder 168 through the second hose 176 and exhausted through the first hose 174. A driven block 176 moves with the piston 172, being held therewith by the interaction between a magnetic field established between a permanent magnetic structure within the driven block 176 and a permanent magnetic structure within the piston 172.

The rails 164 are attached to an intermediate mask support plate 186, which is in turn fastened to an upper mask support plate 188 through a mask support bearing 190. This bearing 190, which is, for example, a ball bearing, provides for rotation between an outer bearing mounting ring 192, extending downward from the upper mask support plate 188, and in inner bearing mounting ring 194, extending upward from the intermediate mask support plate 186. The outer bearing mounting ring 192 is attached to the upper mask support plate 188; the inner bearing mounting ring 194 is attached to the intermediate mask support plate 186, and the outer bearing mounting ring 192 is, for example, pressed into place between the rings 192, 194. Thus, the mask support bearing 188 enables rotation of the intermediate mask support plate 106 on the upper mask support plate 188.

An aperture 195 in the upper mask support plate 188 and an aperture 195a in the intermediate mask support plate 186 are aligned to allow the illumination of the mask 156, 158 from the illumination source 13 (shown in FIG. 1).

FIG. 14 is a vertical cross sectional view taken as indicated by section lines XIV—XIV to show a servomotor 196, which is used to power the rotation allowed by the mask support bearing 190.

Referring to FIGS. 9 and 14, the servomotor 196 is connected through a gearbox 198 to a ball screw 200, which engages a matching nut 202. The servomotor 196 is attached to the upper mask support plate 188, and the nut 202 is attached to the intermediate mask support plate 186, with the ball screw 200 extending in a direction tangential to the mask support bearing 190, so that rotation of the ball screw 200 causes rotation of the intermediate mask support plate 186 under the upper mask support plate 188. As such rotation occurs, it is measured by a linear encoder 205 viewing an adjacent scale 205a. Linear devices, such as the encoder 205 and the ball screw 200 can be used in this way, since the maximum angle of rotation from a nominal centered position is very small.

Referring to FIGS. 2, 9, and 13, the upper mask support plate 188 is slidably mounted to the baseplate 122, being movable downward, in the direction of arrow 62, and opposite thereto, with shafts 206, extending downward from the plate 188 sliding within bushings 208 of support members 209. When the shuttle plate 162 is to be moved to change the glass master 156, 158 through which a substrate 11 is imaged, or the replace the substrate 11 with another, the upper mask support plate 108 is moved upward, separating the glass master 156 or 158 in contact with the substrate 11 from the upper surface of this substrate 11 by about 0.13 mm (0.005 inch). This movement is provided by the rotation of a pair of DC motors servomotors 210, each of which turns an associated ball screw 212. Each servomotor 210 is attached to a support member 214 extending upward from the baseplate 122, and each ball screw 212 engages a nut 216 fastened to the upper mask support plate 188.

Before imaging can occur, alignment is achieved between the substrate 11 on the imaging vacuum chuck 104 and the glass master 156 or 158 in the horizontal directions of arrows 18, 118, rotationally about the axis of rotation of the mask support bearing 190, and vertically in the direction of arrow 62.

FIG. 15 is a fragmentary plan view of a corner of the substrate 11, being held on the imaging vacuum chuck under the glass master 158. In a preferred version of the present invention, a horizontal alignment process in the horizontal directions of arrows 18, 118 is based on the alignment of preprinted fiducial markings 220 on the substrate 11 with fiducial markings 222 on the glass master 158.

Referring to FIGS. 2, 13, and 15, these fiducial markings 220 and 222 are placed at opposite corners 224, 225 of the substrate 11 and the glass master 158, respectively. These markings 220, 222 are viewed by a television camera 226 at each of the corners 224, 225. Each camera 226 is connected to the upper mask support plate 188 by means of a rotary actuator 228, which rotates the camera 226 from the position in which it is shown to the position indicated by dashed lines 230. The rotary actuator 228 may be an electromagnetic or pneumatic device. In the position indicated by dashed lines 230, the camera 226 views the fiducial markings 220, 222 during the alignment process; in the position in which the camera 226 is shown, a light path from the UV exposure lamp is cleared for imaging the substrate 11.

Figure 16:
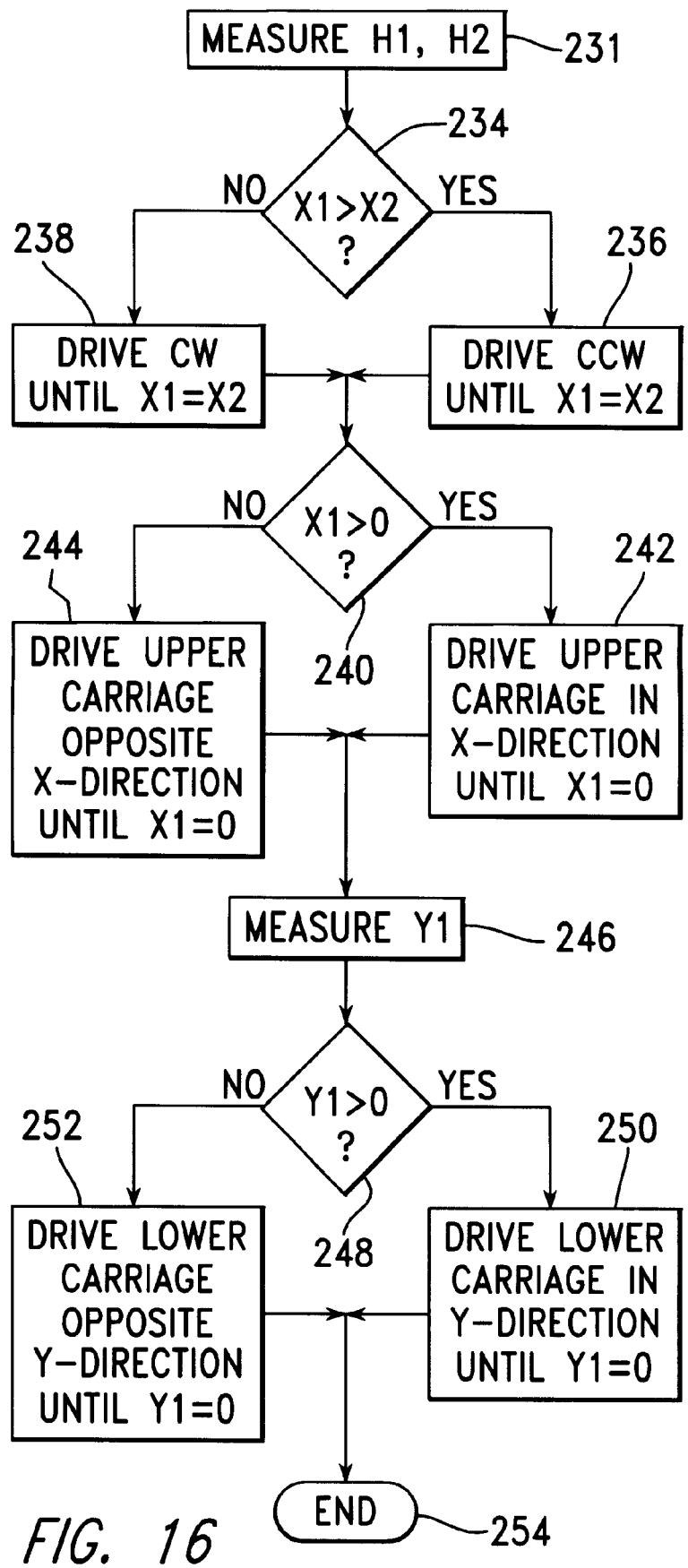
FIG. 16 is a flow chart describing the operation of a subroutine executing in a processor within the first-side imaging station of FIG. 2 for controlling a process for achieving horizontal alignment between a mask and a substrate therein.

FIG. 16 is a flow chart describing the operation of a subroutine executing in a processor (shown in FIG. 26) controlling the horizontal alignment process, which is begun with the servomotor 196 being used to correct the rotational alignment between the glass master 158 and the substrate 11.

Referring to FIGS. 2, 13, and 16, in step 231, errors in alignment of the master 158 to the substrate 11 are measured, resulting in the determination of a first X-direction error in the first corner 224, and of a second X-direction error in the second corner 225. The X-direction errors can be positive or negative, depending on the direction of displacement between the master 158 and the substrate 11. With a positive X-direction error being defined as a misalignment of the glass master 158 relative to the substrate 11 in an X-direction, opposite the direction of arrow 18, a rotation of the glass master 158 in the counterclockwise direction of arrow 232 increases the first X-direction error X1 while decreasing the second X-direction error X2. On the other hand, a rotation of the glass master 158 in the clockwise direction, opposite the direction of arrow 232, decreases the first X-direction error X1 and increases the second X-direction X2.

Therefore, after the first and second X-direction errors are measured, in step 234, these errors are compared. If the first X-direction error X1 is greater than the second X-direction error X2, the servomotor 196 is used to rotate the glass master 158 counterclockwise, in the direction of arrow 232, in step 236, decreasing the first X-direction error X1 and increasing the second X-direction error X2, until these errors are equal. The values of these errors are recalculated from measurements made as the glass master 158 is rotated. On the other hand, if the first X-direction error X1 is not greater than the second X-direction error X2, the servomotor 196 is used to rotate the glass master 158 clockwise, in step 238, increasing the first X-direction error X1 and decreasing the second X-direction error X2 until these errors are equal. Due to the fact that fiducial markings 222 on the glass master must match the fiducial markings 220 on the substrate 11, when the X-direction errors are equal, the corresponding errors in the Y-direction are also equal, and the glass master 158 has been rotationally aligned with the substrate 11.

Next, in block 240, a determination is made of whether the X-direction error X1 is greater than zero, indicating that the glass master 158 is displaced from alignment with the substrate 11 in the X-direction. If X1 is greater than zero, in block 242, the upper carriage 146 is driven in the X-direction by linear motor 151 until X1 is measured to be zero. On the other hand, if X1 is not greater than zero, in block 244, the upper carriage 146 is driven opposite the X-direction by linear motor 151 until X1 is measured to be zero.

Next, in block 246, an error in alignment of the master 158 to the substrate 11 in the first corner 224 is measured, resulting in the determination of a first Y-direction error Y1. Since the master 158 has previously been angularly aligned with the substrate 11, as described above, the Y-direction error at the second corner 225 is not measured, being equal to the measured Y-direction error Y1.

If Y1 is determined in block 248 to be greater than zero, the glass master 158 is displaced from alignment with the substrate 11 in the Y-direction, so in block 250, the lower carriage 112 is driven in the Y-direction by linear motor 124 until Y1 is measured to be zero. On the other hand, if Y1 is not greater than zero, in block 252, the lower carriage i112 s driven opposite the Y-direction by linear motor 124 until Y1 is measured to be zero. The measurements described above are preferably made using the camera 226 in the first corner 224 as the prescribed movements are being made. Following the step 250 or 252, this subroutine is ended in step 254.

Figure 17:
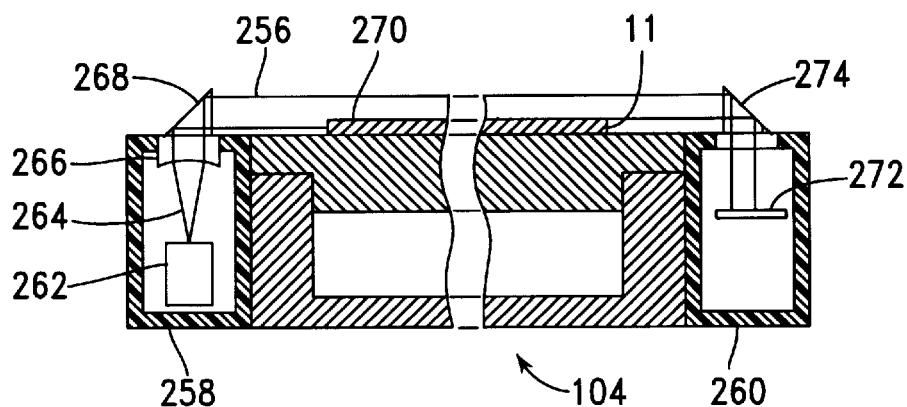
FIG. 17 is a fragmentary vertical cross-sectional view of the first-side imaging station of FIG. 2, taken as indicated by section lines XVII—XVII in FIG. 8 to show optical apparatus used to sense a gap distance between the mask and substrate in FIG. 2.

FIG. 17 is a vertical cross-sectional view of the first-side imaging station of the apparatus of FIG. 1, taken as indicated by section lines XVII—XVII in FIG. 8 to show the apparatus used to sense the gap distance between the glass master 156, 158 and the substrate 11. Referring to FIGS. 7 and 17, the distance between the substrate 11 and a glass master 156, 158 above the substrate 11 is measured by examining the height of two collimated inspection laser beams 256 directed across the top of the substrate 11. Each of these collimated inspection laser beams 256 is established by a transmitter 258 and received by a detector 260. These two laser beams 256 each extend diagonally across the substrate 11, with the detector 260 being adjacent to a piezoelectric actuator 153. During the process of bringing the glass master 156, 158 into contact with the substrate 11 held atop the imaging chuck 104, the outputs of detectors 260 are used first to determine when the glass master 156, 158 has approached the substrate 11, and then in a leveling procedure in which the upper surface of the substrate 11 is made parallel to the glass master. The transmitter 258 includes a red laser diode 262 to produce a visible output beam 264, which is collimated by a converging lens 266 and reflected within a first prism 268 to form a collimated inspection beam 256 shining across the upper surface 270 of the substrate 11. The detector 260 includes CCD (Charge Coupled Device) array 272, upon which a reflection of the inspection laser beam 256 is directed by means of a second prism 274. The various photosensitive elements within the CCD array 272 are sampled to develop output signals representing the height of the inspection laser beam 256. For operation in accordance with the present invention, it is assumed that the signals from individual photosensitive elements are processed and compared in a manner producing an output signal reflecting the height of the laser beam 276 as it is restricted by transmission between the glass master and the substrate. Transmitter and detector units of this general construction, together with associated processing circuitry, are available from Keyence under their trade name VG Series CCD Laser Micrometer.

Figure 18:
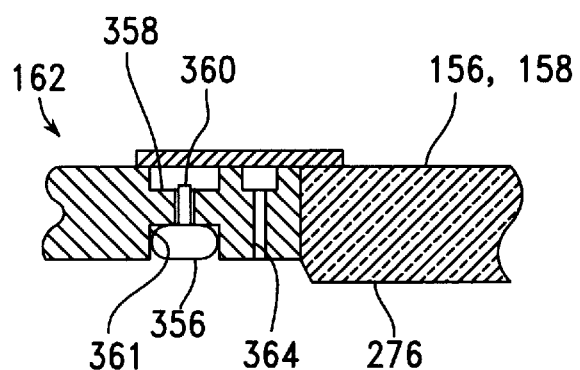
FIG. 18 is a fragmentary vertical cross sectional view of the shuttle plate of FIG. 13, taken as indicated by section lines XVIII—XVIII therein to show provisions made within the shuttle plate at each edge of a master therein.

FIG. 18 is a fragmentary vertical cross-sectional view of the shuttle plate 162, taken as indicated by section lines XVIII—XVIII in FIG. 13 to show various provisions made at each edge of the glass masters 156, 158. To facilitate the use of the apparatus and method described above in reference to FIG. 17 for measuring the distance between the glass master 156, 158 and the substrate 11, and for establishing a condition of parallelism therebetween, the lower surface 276 of the glass master 156, 158 is arranged to be lower than adjacent portions of the shuttle plate 162 when such measurements are made.

Referring to FIGS. 8, 17, and 18, each of the light paths 256 includes a central portion 278 which extends between the glass master 156, 158 and the substrate 11. With the assumption being made that both the upper surface 270 of the substrate 11 and the lower surface 276 of the glass master 156, 158 are flat, the actual measurement from each detector 260 is determined by the distance between the glass master and the substrate at the end of this central portion 278 of the light path 256 extending to the detector 260 at which the lower surface 276 of the glass master and the upper surface 270 substrate are closest together. The end of this central portion 278 at which these surfaces 270, 276 are closer together may be the end which is nearer to, or farther from, the detector 260. Increasing or decreasing the distance between the glass master and the substrate at the end at which these surfaces 270, 276 are closer together causes a significant change in the output signal from the detector 260, while increasing or decreasing the distance between the glass master and the substrate at the end at which these surfaces 270, 276 are farther apart has relatively little effect on the output signal from the detector 260.

If the separation between the surfaces 270, 276 is held at a constant level along one of the light paths 256, the surfaces 270, 276 may not be parallel, with these surfaces 270, 276 being rotated relative to one another about the light path 256 along which they are parallel. However, if the separation along both of the light paths 256 is held at a constant level, the entire surfaces 270, 276 are parallel to one another, with the assumption that these surfaces 270, 276 are each flat. Therefore, the method of the present invention for adjusting the surfaces 270, 276 to be parallel to one another includes adjusting these surfaces to be parallel along a first of the light paths 256, and then along the other light path 256.

Figure 19:
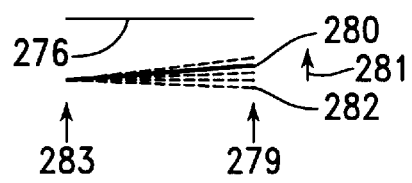
FIG. 19 is a pictorial representation of a first method to bring an upper surface of a substrate into a parallel condition with the lower surface of a mask within the first-side imaging station of FIG. 2, showing the process as occurring when an initially-raised corner of the substrate is closer to the mask than an opposite corner thereof.
Figure 20:
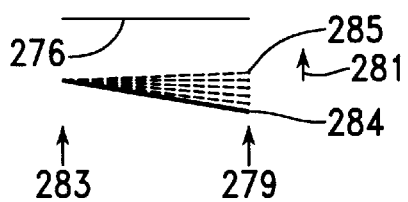
FIG. 20 is a pictorial representation of the first method of FIG. 19, showing the process as occurring when the initialized-raised corner of the substrate is farther from the mask than the opposite corner thereof.

FIGS. 19 and 20 are pictorial representations of a first method for bringing the upper surface 270 of the substrate 11 into alignment with the lower surface 276 of the glass master 156, 158. With this method, a corner of the substrate 11 is first brought closer to the glass master. Such a movement of the substrate 11 is expected either to narrow the collimated laser beam 278 passing adjacent to the corner which has been moved, or to have no significant effect on the width of this laser beam, depending on the angular direction in which the upper surface 270 is out of alignment with the lower surface 276.

Referring to FIGS. 17–19, in the example of FIG. 19, the narrowest spacing between the upper surface 270 and the lower surface 276 is at the end 279 of the collimated laser beam 278 closer to the associated actuator 153, as indicated by the initial substrate position 280. The corner of the substrate 11 closest to the actuator 153 is first moved in the engagement direction (toward the glass master), as indicated by the arrow 281. This action causes the width of the collimated laser beam 278 to become narrower, so the corner of the substrate 11 closest to the actuator 153 is next moved opposite the engagement direction until such motion fails to increase the width of the collimated laser beam 278, indicating that a parallel condition has just been passed, with the upper surface 270 lying as indicated by line 282.

In the example of FIG. 20, the narrowest spacing between the upper surface 270 and the lower surface 276 is at the end 282 of the collimated laser beam 278 farther from the associated actuator 153, as indicated by the initial substrate position 283. When the corner of the substrate 11 closest to the actuator 153 is moved in the engagement direction, as indicated by the arrow 278, the collimated laser beam 278 fails to become narrower when the corner of the substrate 11 closest to the actuator 153 is first moved in the engagement direction, as indicated by arrow 278. Therefore, this motion is continued until it is determined that an incremental movement has caused the collimated laser beam to become narrower. This means that the parallel condition has just been passed, with the upper surface 270 lying as indicated by line 285.

Figure 21:
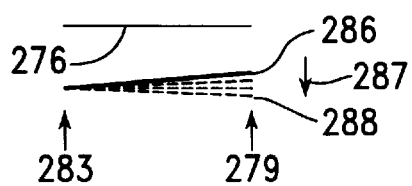
FIG. 21 is a pictorial representation of a second method to bring the upper surface of the substrate into a parallel condition with the lower surface of the mask within the first-side imaging station of FIG. 2, showing the process as occurring when an initially-lowered corner of the substrate is closer to the mask than an opposite corner thereof.
Figure 22:
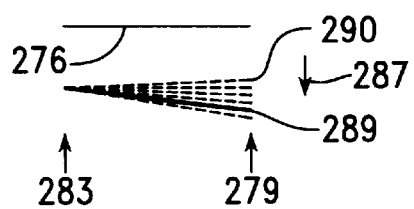
FIG. 22 is a pictorial representation of the first method of FIG. 19, showing the process as occurring when the initialized-lowered corner of the substrate is farther from the mask than the opposite corner thereof.

FIGS. 21 and 22 are pictorial representations of a second method for bringing the upper surface 270 of the substrate 11 into alignment with the lower surface 276 of the glass master 156, 158. With this method, a corner of the substrate 11 is first moved away from the glass master. Such a movement of the substrate 11 is expected either to widen the collimated laser beam 278 passing adjacent to the corner which has been moved, or to have no significant effect on the width of this laser beam, depending on the angular direction in which the upper surface 270 is out of alignment with the lower surface 276.

Referring to FIGS. 17, 18, and 21, in the example of FIG. 21, the narrowest spacing between the upper surface 270 and the lower surface 276 is at the end 279 of the collimated laser beam 278 closer to the associated actuator 153, as indicated by the initial substrate position 286. The corner of the substrate 11 closest to the actuator 153 is first moved opposite the engagement direction (away from the glass master), as indicated by the arrow 287. This action causes the width of the collimated laser beam 278 to become wider, so this movement is continued until such motion decreases the width of the collimated laser beam 278, indicating that a parallel condition has just been passed, with the upper surface 270 lying as indicated by line 288.

In the example of FIG. 22, the narrowest spacing between the upper surface 270 and the lower surface 276 is at the end 283 of the collimated laser beam 278 farther from the associated actuator 153, as indicated by the initial substrate position 289. When the corner of the substrate 11 closest to the actuator 153 is moved opposite the engagement direction, as indicated by the arrow 287, the collimated laser beam 278 fails to become wider. Therefore, this motion is continued until it is determined that an incremental movement has caused the collimated laser beam to become narrower. This means that the parallel condition has just been passed, with the upper surface 270 lying as indicated by line 290.

Figure 23:
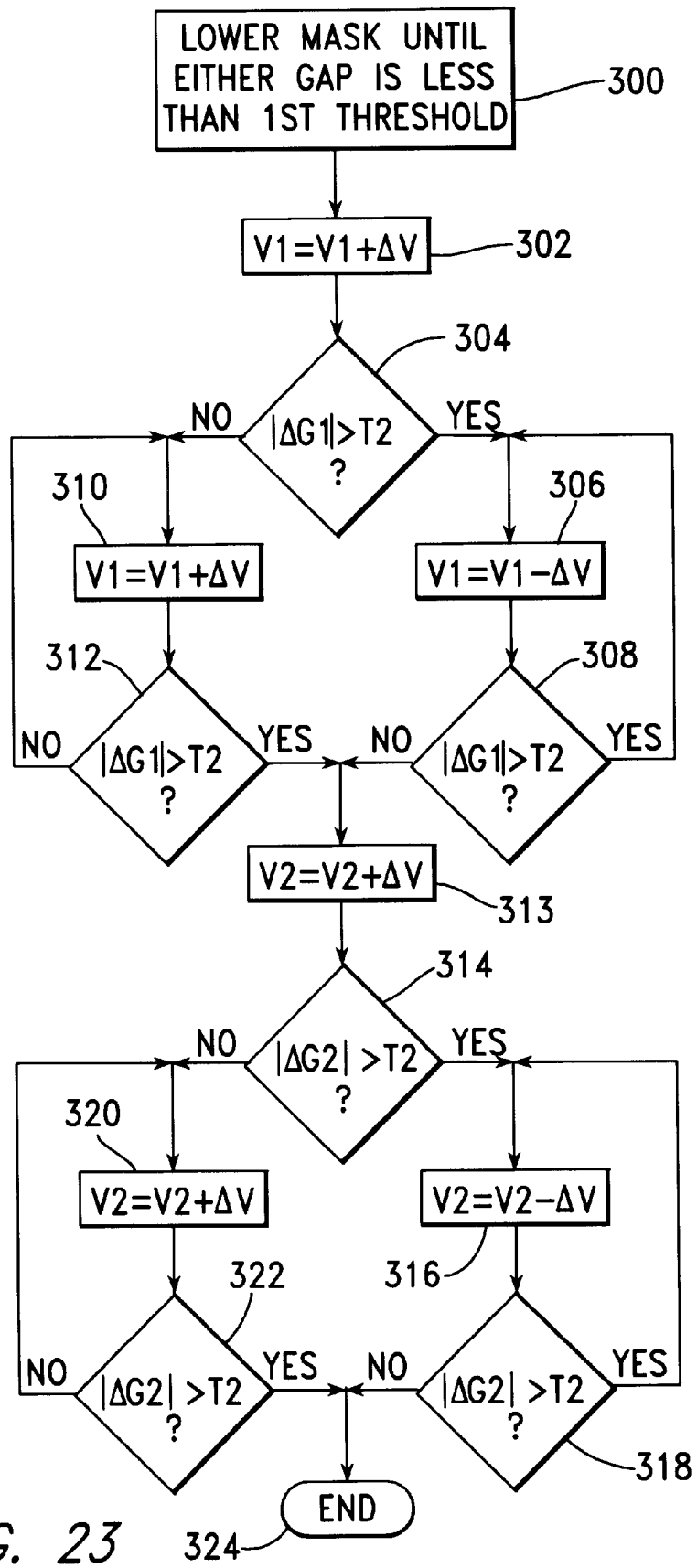
FIG. 23 is a flow chart describing process steps executing in a processor within the first-side imaging station of FIG. 2 to control the first method of FIGS. 19 and 20.

FIG. 23 is a flow chart describing the operation of a first version of a program executing in a processor (not shown) controlling the vertical closure of the glass master 156 or 158 on the substrate 11. Referring to FIGS. 9, 17, and 23, in the first step 300 of FIG. 19, the glass master 156 is brought downward, toward the substrate 11 by moving the upper support plate 188 downward by means of both servomotors 210. The servomotors 210 are for this initial step, instead of the piezoelectric actuators 153, to reduce the time required to increase or decrease the separation between the substrate 11 and the glass master 156 or 158. The piezoelectric actuators require 0.83 sec to change this separation by 0.025 mm (0.001 inch). During this process, the downward motion of the glass master 156 or 158 is stopped when the minimum gap indicated by either of the detectors 260 falls below a threshold level.

At this time, the direction at which lower surface 276 of the glass master 156 or 158 is tilted relative to the upper surface 270 of the substrate 11 is not known. Nevertheless, in step 302, the voltage V1 applied to a first piezoelectric actuator 153-1 is increased by a an incremental value ΔV, causing this actuator 153-1 to lengthen, moving the adjacent portion of the imaging platen 104 upward in a motion pivoting about the pivot post 153a. Then, in step 304, |ΔG1|, the absolute value of the change in the gap measured by the first detector 260-1 is compared to a second threshold value, T2. The first detector 260-1 is adjacent the first actuator 153-1. If the value of |ΔG1| is greater than T2, it is known that the closest portion of the gap between the surfaces 270, 276 along the light path 276 observed by the first detector 260-1 is at the corner of the substrate 11 which has been moved upward, and that this gap has indeed been reduced by the action taken in step 302. This is the condition described above in reference to FIG. 19. Therefore, in step 306, the voltage applied to the first actuator 153-1 is reduced by the incremental value ΔV, causing this actuator 153-1 to shorten. In step 308, |ΔG1| is again compared to T2. As long as |ΔG1| is greater than the threshold value, it is known that the minimum gap measured by the first detector 260-1 has been increased by the action taken in step 286, with closest portion of the gap between the surfaces 270, 276 along the light path 276 observed by the first detector 260-1 still being at the corner of the substrate 11 which has been moved upward, so the processes of steps 306 and 308 are repeated. When it is determined in step 308 that |ΔG1| is less than the second threshold value, it is known that the upper surface 270 of the substrate 11 has been driven to be parallel to the lower surface 276 of the glass master 156, 158 along the light path observed by the first detector 260-1.

On the other hand, if it is determined in step 304 that |ΔG1| is not greater than the second threshold value, it is known that the closest portion of the gap between the surfaces 270, 276 along the light path 256 observed by the first detector 260-1 is farthest from the corner which has been moved, and that this gap has not been significantly reduced by the action taken in step 302. This is the situation discussed above in reference to FIG. 20. Therefore, in step 310, the voltage applied to the first actuator 153-1 is increased by the incremental value ΔV, causing this actuator 153-1 to lengthen. In step 312, |ΔG1| is again compared to T2. As long as |ΔG1| is less than the threshold value, it is known that the minimum gap measured by the first detector 260-1 has not been increased by the action taken in step 310, with the closest portion of the gap between the surfaces 270, 276 along the light path 256 observed by the first detector 260-1 still being diagonally opposite the corner of the substrate 11 which has been moved upward, so the processes of steps 310 and 312 are repeated. When it is determined in step 312 that |ΔG1| is greater than the second threshold value, it is known that the upper surface 270 of the substrate 11 has been driven to be parallel to the lower surface 276 of the glass master 156, 158 along the light path observed by the first detector 260-1.

When either step 308 or 312 indicates that the surfaces 270 and 276 are parallel along the light path 256 observed by the first detector 260-1, the second piezoelectric actuator 153-2 is used, along with the second detector 260-2, to bring the surfaces 270 and 276 into a parallel condition along the light path 256 observed by this second detector 260-2.

First, in step 313, the voltage V2 applied to a second piezoelectric actuator 153-2 is increased by a the incremental value ΔV, causing this actuator 153-2 to lengthen moving the adjacent portion of the imaging platen 104 upward in a motion pivoting about the pivot post 153a. Then, in step 314, |ΔG2|, the absolute value of the change in the gap measured by the second detector 260-2 is compared to the second threshold value, T2. The second detector 260-2 is adjacent the second actuator 153-2. If the value of |ΔG2| is greater than T2, it is known that the closest portion of the gap between the surfaces 270, 276 along the light path 276 observed by the second detector 260-2 is at the corner of the substrate which has been moved, and that this gap has indeed been reduced by the action taken in step 313. Therefore, in step 316 the voltage applied to the second actuator 153-2 is reduced by the incremental value ΔV, causing this actuator 153-2 to shorten. In step 318, |ΔG1| is again compared to T2. As long as |ΔG2| is greater than the threshold value, it is known that the minimum gap measured by the second detector 260-2 has been increased by the action taken in step 316, with closest portion of the gap between the surfaces 270, 276 along the light path 276 observed by the second detector 260-2 still being at the corner of the substrate 11 which has been moved upward, so the processes of steps 316 and 318 are repeated. When it is determined in step 318 that |ΔG2| is less than the second threshold value, it is known that the upper surface 270 of the substrate 11 has been driven to be parallel to the lower surface 276 of the glass master 156, 158.

On the other hand, if it is determined in step 314 that |ΔG2| is not greater than the second threshold value, it is known that the closest portion of the gap between the surfaces 270, 276 along the light path 256 observed by the second detector 260-2 is at the end of this light path diagonally opposite the corner which has been moved, and that this gap has not been significantly reduced by the action taken in step 313. Therefore, in step 320, the voltage applied to the second actuator 153-2 is increased by the incremental value ΔV, causing this actuator 153-2 to lengthen. In step 322, |ΔG2| is again compared to T2. As long as |ΔG2| is less than the threshold value, it is known that the minimum gap measured by the second detector 260-2 has not been increased by the action taken in step 320, with the closest portion of the gap between the surfaces 270, 276 along the light path 256 observed by the second detector 260-2 still being at the corner of the substrate 11 diagonally opposite the corner which has been moved upward, so the processes of steps 320 and 322 are repeated. When it is determined in step 322 that |ΔG1| is greater than the second threshold value, it is known that the upper surface 270 of the substrate 11 has been driven to be parallel to the lower surface 276 of the glass master 156, 158.

When either step 318 or 322 indicates that the surfaces 270 and 276 are parallel along the light path 256 observed by the first detector 260-1, it is known that the surfaces 270, 276 are parallel, so the routine controlling this alignment process is ended in step 324. The combined processes of lowering the glass master 156, 158 toward the substrate 11 preferably place the surfaces 270, 276 parallel to one another within 6 microns at a spacing of 0.25 mm (0.001 inch).

Figure 24:
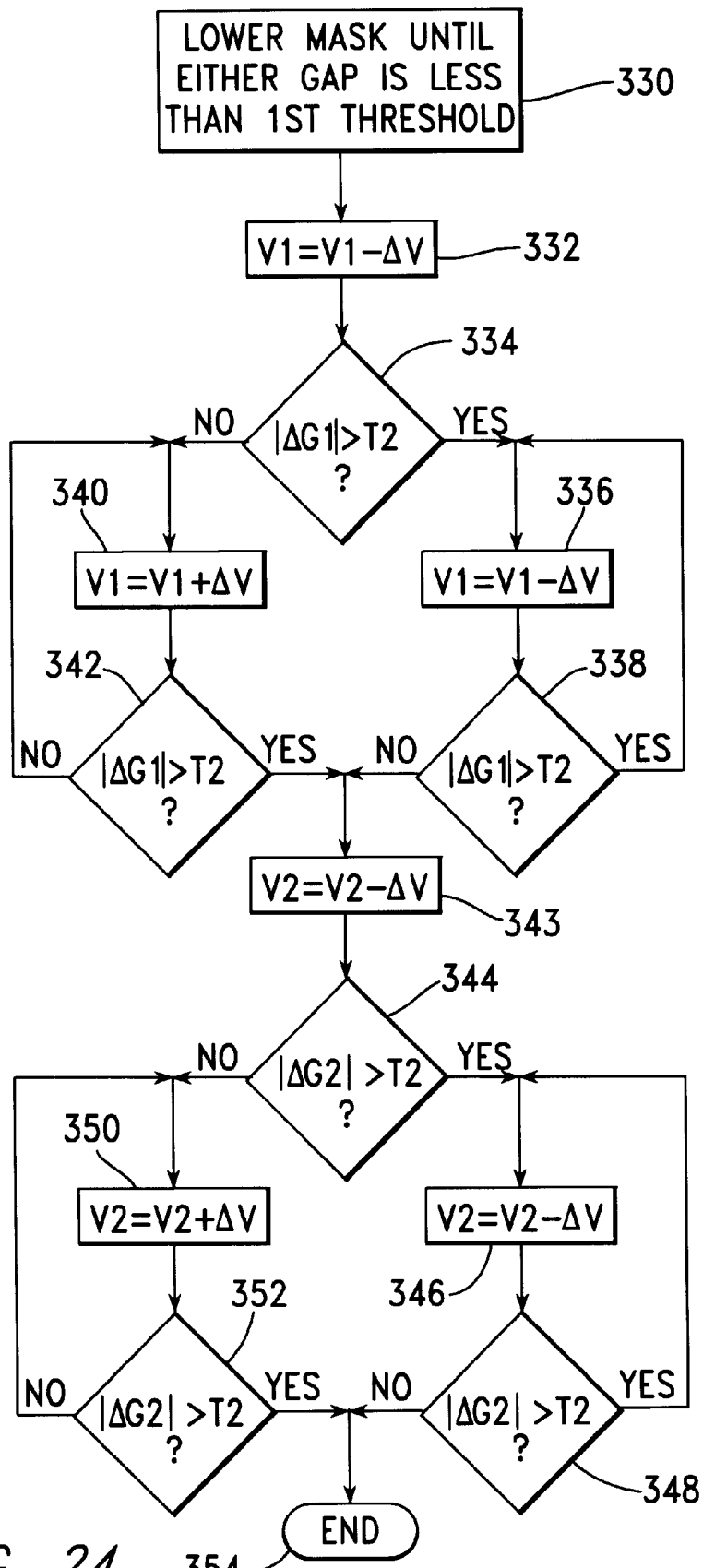
FIG. 24 is a flow chart describing process steps executing in a processor within the first-side imaging station of FIG. 2 to control the second method of FIGS. 21 and 22.

FIG. 24 is a flow chart of a second version of a subroutine executing in a controller controlling the alignment process. While the first version of this subroutine, which has been described above in reference to FIG. 23, begins in each instance with moving a corner of the substrate 11 upward toward the glass master 156, 158, in an engagement direction, the second version of FIG. 24 begins in each instance with moving a corner of the substrate 11 downward, opposite this engagement direction. This downward movement either increases the width of the gap between the substrate and the glass master or makes no significant difference in this width.

Referring to FIGS. 17, 18, and 24, the second process is begun in step 330 by lowering the glass master 156 or 158 until the gap measured by either detector 260 is smaller than a first threshold level. Next, in step 332, the voltage applied to the first piezoelectric actuator, 153-1 is decreased by a decremental level, ΔV, and the resulting change in the gap width measured by the first detector 260-1. If this gap width is changed beyond the level of a second threshold value, as determined in step 334, the gap along the light path 256 measured by the first detector 260-1 is smallest at the corner of the substrate 11 which has been moved downward, as discussed above in reference to FIG. 21. Thus, this downward movement is continued in step 336, with measurements being made in step 338, until a lack of change in the gap width, as measured in step 338, indicates that a parallel condition has been reached.

On the other hand, if the measurement taken in step 334 indicates that the change in gap, as measured by the first detector 260-1, is not changed significantly, it is known that the corner of the substrate 11 having the narrowest distance to the glass master 156 or 158 is the corner diametrically opposite the corner which has been moved downward, as in the example of FIG. 22. Therefore, the voltage applied to the first actuator 153-1 is incrementally increased in step 340, with repeated measurements of the resulting change being made in step 342.

When a measurement from either step 338 or step 342 indicates that the gap along the light path 256 measured by the first detector 260-1 has been driven through a condition of parallelism between the substrate 11 and the glass master 156 or 158, in step 343, the voltage applied to the second piezoelectric actuator, 153-2 is decreased by a decremental level, ΔV, and the resulting change in the gap width measured by the second detector 260-2. If this gap width is changed beyond the level of a second threshold value, as determined in step 344, the gap along the light path 256 measured by the first detector 260-1 is smallest at the corner of the substrate 11 which has been moved downward, as discussed above in reference to FIG. 21. Thus, this downward movement is continued in step 346, with measurements being made in step 348, until a lack of change in the gap width, as measured in step 348, indicates that a parallel condition has been reached.

On the other hand, if the measurement taken in step 344 indicates that the change in gap, as measured by the first detector 260-1, is not changed significantly, it is known that the corner of the substrate 11 having the narrowest distance to the glass master 156 or 158 is the corner diametrically opposite the corner which has been moved downward, as in the example of FIG. 22. Therefore, the voltage applied to the first actuator 153-1 is incrementally increased in step 350, with repeated measurements of the resulting change being made in step 352.

When a measurement from either step 338 or step 342 indicates that the gap along the light path 256 measured by the first detector 260-1 has been driven through a condition of parallelism between the substrate 11 and the glass master 156 or 158, this subroutine ends in step 354.

Referring again to FIGS. 2 and 18, after this alignment process, whether performed according to the first method of FIG. 23 or the second method of FIG. 24, the inflatable bellows 155 is actuated, forcing the substrate 11 into uniform contact with the glass master 156 or 158 with a predetermined contact force. As this contact loading occurs, air is admitted into the vacuum plenum chamber 106, so that the substrate 11 is released from the imaging platen 107 of the imaging vacuum chuck 104.

In a preferred version of the present invention, as the glass master 156 or 158 is moved close to the substrate 11, the space therebetween is sealed from the surrounding atmosphere by an inflatable gasket 356 extending around the periphery of the glass master 156 or 158. This gasket 356 is inflated by driving pressurized air into a slot 358 within the shuttle 192. Tubular portions 360 of the inflatable gasket 356 extend toward the slot 358. The inflatable gasket 356 is held in place within a groove 362 by means of mechanical interferences or by means of adhesive attachment. As the bellows 155 is actuated to bring the substrate 11 into contact with the glass master 156 or 158, the inflatable gasket 306 surrounding the glass master 156 or 158 is brought, by inflation, into contact with the substrate 11. Then, air from the portion of the gap between the glass master and the substrate surrounded by the gasket 356 is evacuated through a number of holes 364 extending to a slot 318 between the gasket 306 and the glass master 156 or 158.

Next, the substrate 11 is imaged by exposure through the glass master 156 or 158 to UV energy from the lamp 13. When this exposure is completed, the substrate 11 and the glass master are separated, with a vacuum seal between the substrate 11 and the glass master being broken by means of a nitrogen purge applied through the holes 364. After this nitrogen purge, the gasket 356 is deflated.

An alternative version of the present invention does not include the inflatable bellows 155, relying instead on the vacuum drawn through the holes 364 and the pressurization of the vacuum plenum chamber 66 to draw the substrate 11 directly to the glass master 156 or 158.

This apparatus may be used in a number of different ways. For example, the substrate 11 may be imaged through both the step and repeat glass master 156 and the full size glass master 158. In this process, the full size glass master 158 is used to expose a border area of the substrate 11 to UV energy from the lamp 13, with energy within an area within a central area being blocked by an opaque portion of the full size glass master 158. The step and repeat master 156 is used to expose the central area within the border area to a repeating image of circuit patterns. During the use of the step and repeat master 156, the linear motors 124, 151 are used to move the imaging vacuum platen 104 so that the various positions of the substrate 11 to be exposed are sequentially moved under the master 156. Either the full size glass master 158 or the step and repeat glass master 156 is used first, with the other glass master being used thereafter. The two glass masters 156, 158 may be alternately used first, minimizing the need for their movement.

The process for aligning fiducial markings on the glass master 156, 158 with the fiducial markings on the substrate 11 is needed primarily to correct changes in the stopping position of the substrate 11 as it is carried through various steps in the process. In general, the glass masters 156, 158 are located in the shuttle plate 162 accurately enough, with respect to one another, that it is not necessary to make such corrections when a second glass master is brought into place above the substrate 11, provided that such corrections have been made with the previous glass master in place. In this case, the fiducial markings 222 only on the full-size glass master 158 are used for alignment when both of the masters 156, 158 are used for imaging the substrate 11. With each substrate 11, the full-size glass master 158 is first aligned and used for imaging. Next, the step and repeat master 156 is used for imaging.

Alternately, when this alignment process is required for alignment of the substrate 11 with the step and repeat master 156, the television cameras 226 are moved diagonally inward to view the corners of the smaller glass master 156.

On the other hand, since the process of bringing the substrate 11 into a parallel condition with respect to the upwardly adjacent glass master 156, 158 uses two diagonal illuminated lines 256 crossing at or near the center of the glass master 156, 158, this process is easily used for both glass masters 156, 158.

At the end of the imaging process, the imaging vacuum chuck 104 is returned to the position in which it is shown in FIG. 2, directly below the transport carriage 30. The transport vacuum chuck 45 is then moved downward, in the direction of arrow 62, by means of the linear actuator 54, until the transport platen 50 is brought into contact with the substrate 11. Next, the vacuum chamber 48 within the transport vacuum chuck 45 is evacuated, and air is returned to the opening 68 within the vacuum plenum chamber 66, so that the substrate 11 is transferred from the imaging vacuum chuck 104 to the transport vacuum chuck 45.

Referring to FIGS. 1, 6, and 7, the crank 88 in stop mechanism 86 is next rotated upward by means of actuator 94, releasing the post 96 extending upward as a part of the transport carriage 30, so that the transport carriage 30 is moved in the direction of arrow 18, with air being driven into the rodless cylinder 76 through hose 82.

Figure 25:
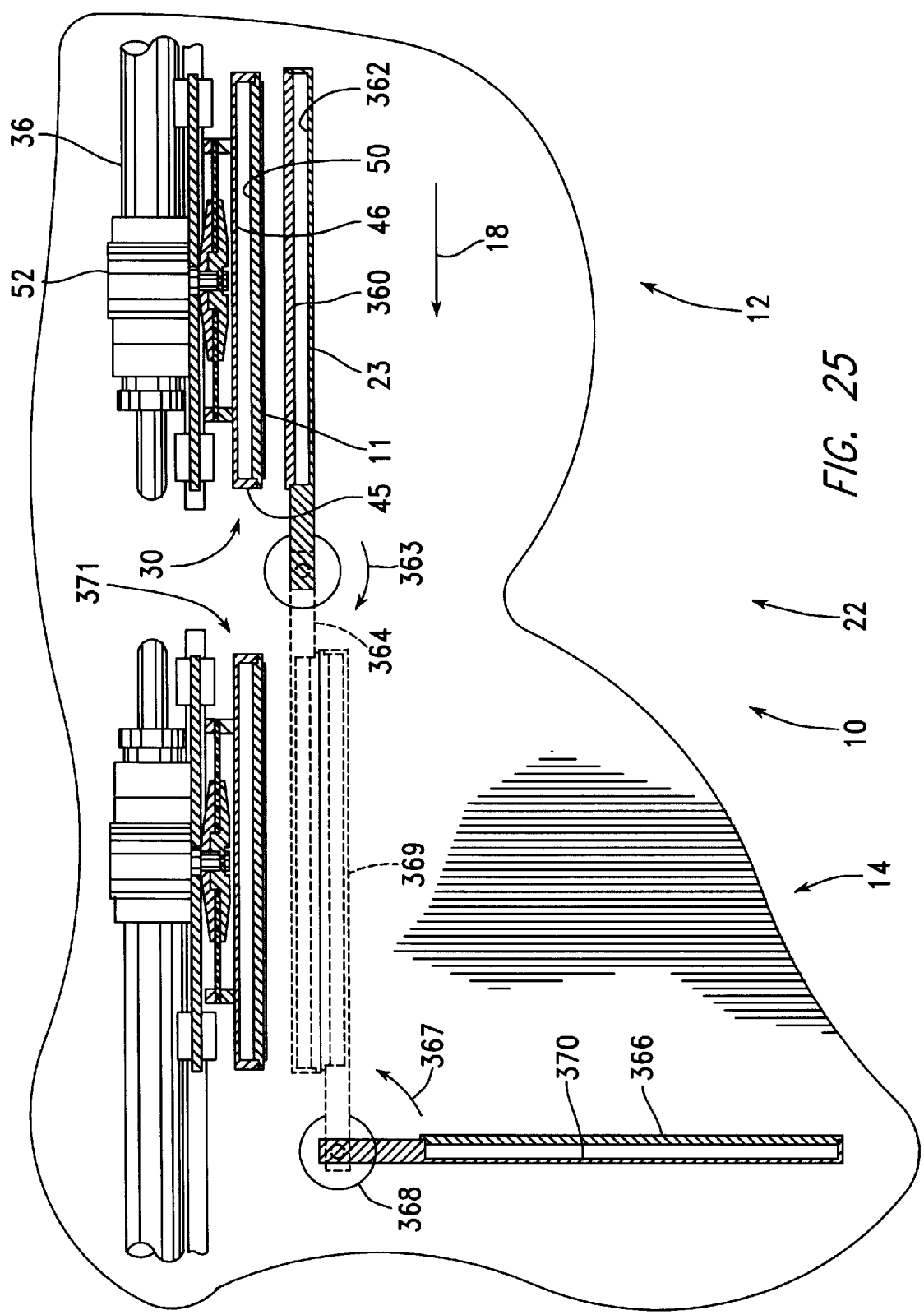
FIG. 25 is longitudinal cross-sectional view of an intermediate section of the automated imaging system of FIG. 1, showing apparatus used to invert a substrate as it is transferred from the first-side imaging station to a second-side imaging station therein.

FIG. 25 is a longitudinal cross-sectional view of the automated imaging system 10, particularly showing the pivoting transfer carrier 23 and devices associated therewith within the intermediate station 22.

Referring to FIGS. 1 and 25, following the imaging process, the transport carriage 30 moves the substrate 11 into the position shown in FIG. 25, which is also the position indicated by dashed lines 39 in FIG. 1. This movement positions the substrate 11 directly above the pivoting transfer carrier 23, which extends toward the first imaging station 10, also as shown in FIG. 25. Next, the transport vacuum chuck 45 is lowered using the linear actuator 52 until the substrate 11 is brought into contact with a platen 360 of the pivoting carrier 23. Up to this point, the plenum chamber 46 within the vacuum chuck 45 has been evacuated to hold the substrate 11 in place on the transport platen 50. Now, air is allowed to enter the plenum chamber 46, while a plenum chamber 362 within the pivoting transfer carrier 23 is evacuated. In this way, the substrate 11 is transferred from the transport carriage 30 to the pivoting carrier 23.

At this point, the transport carriage 30 may be returned, opposite the direction of arrow 18, to the initial position indicated by dashed lines 37, in which it is ready to pick up the next substrate 11 from the input tray 16.

The pivoting transfer carrier 23 is next pivoted, in the direction of arrow 363, into the position indicated by dashed lines 364 by means of an actuator 365 rotating through a 180-degree angle. The actuator 365 may be a pneumatic or electromechanical device. This motion inverts the substrate 11, so that its first side, which has been imaged, now faces downward, with the side which faced downward going through the first imaging process now facing upward. This motion must occur with the pivoting input carrier 366 of the second-side imaging station 14 extending downward as shown. Next, with the pivoting transfer carrier 23 held in the position indicated by dashed lines 364, the pivoting input carrier 366 is rotated upward, in the direction of arrow 367, by means of another rotary actuator 368, into the position indicated by dashed lines 369. This motion brings the substrate 11 into position between the pivoting transfer carrier 23 and the pivoting input carrier 366, allowing the substrate 11 to be transferred from the pivoting transfer carrier 23 to the pivoting input carrier 366 by pressurizing the plenum chamber 362 of the pivoting transfer carrier 23 while the plenum chamber 370 of the pivoting input carrier 366 is evacuated. Each of the plenum chambers 362, 370 are connected to a source of pressurized air and to a vacuum pump by means of solenoid valves (not shown).

Next, the pivoting input carrier 366 is pivoted opposite the direction of arrow 367 to provide clearance for the return movement of the pivoting transfer carrier 23. When this movement has been completed, the pivoting input carrier 366 is pivoted upward, in the direction of arrow 367, into a position directly below the transport carriage 371 of the second-side imaging station 14. During these movements, the substrate 11 is held in place on the pivoting input carrier 366 by a continued application of a vacuum to the plenum chamber 366. The transport carriage 371 in the second-side imaging station 14 has been brought into the position shown in FIG. 26 and by dashed lines 372 in FIG. 1, being moved opposite the direction of arrow 18. From this position, the transport carriage 371 within the second-side imaging station 14 moves the substrate 11 through the various processes previously described in reference to the operation of first-side imaging station 12, but with the second side of the substrate 11 facing upward, so that it is imaged. That is, the transport carriage within the second-side imaging station 14 moves from the position indicated by dashed lines 372 to the position indicated by dashed lines 374, at which the substrate is transferred to an imaging platen so that the second side of the substrate is imaged. Following imaging, the substrate 11 is returned to the transport carriage within the second-side imaging station 14, which then moves to the position indicate by dashed lines 376. From this position, the transport carriage within the second-side imaging station 14 transfers the substrate 11 into the output tray 20.

The exemplary intermediate station 22 described above in reference to FIG. 25 includes a pivoting input carriage 366 to allow movement of the pivoting transfer carriage 23 from the position in which it is shown in the direction of arrow 363. Initial movement opposite this direction, i.e. upward rather than downward, is blocked by the presence of rodless cylinder 36 extending above the pivoting transfer carriage 23. Alternately, the input carriage can be stationary, in the position indicated by dashed lines 369, with the imaging apparatus 12 being enlarged to allow the placement of the rodless cylinder extending outside, not above, the pivoting transfer carriage 23.

Of particular importance is the registration between the images, or "latent" images, placed on the second side of the substrate 11 with the images placed on its first side. Before the substrate 11 is placed in the imaging system 10, fiducial markings are place on both sides of the substrate. This can be done quite accurately, providing an accurate registration between the first and second sides of the substrate 11. Thus, on both the first and second sides of the substrate 11, the registration of the images is derived from a position of fiducial markings on that side.

Figure 26:
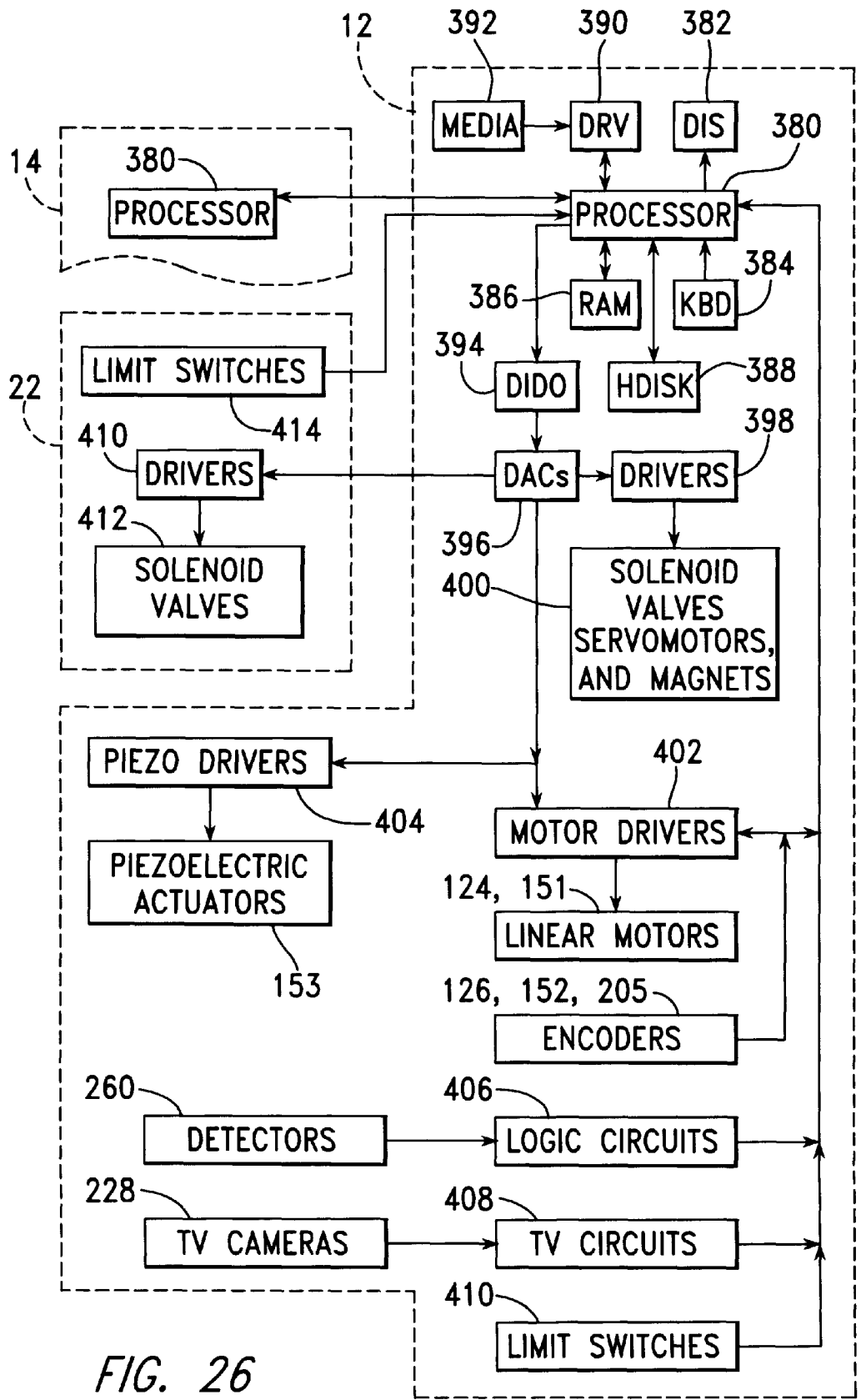
FIG. 26 is a block diagram of electronic devices used to control and operate the automated imaging system of FIG. 1.

FIG. 26 is a block diagram of the electronic devices used to control and operate the automated imaging apparatus 10. Each imaging station 10 is controlled by a processor 380 having an associated display unit 382, a keyboard 384 for data entry, a random access memory 386, a hard-disk drive 388 for instruction and data storage, and a media drive 390, into which computer media 392 are placed to load programs used to run the apparatus 10. The programs include the subroutines described above in reference to FIG. 16 and in reference to either FIG. 23 or FIG. 24.

Referring to FIGS. 2 and 26, within each imaging station 10, 12, various devices are driven from a port of the processor 380 through a DIDO unit 394 (Digital In-Digital Out), which expands the number of output ports accessible from the processor. The DIDO unit 394 in turn drives a number of DACs 396, (Digital to Analog Convertors), which convert the digital output signals from the DIDO unit 394 into analog signals used to drive various devices. Some of the outputs of the DACs 396 are directed through magnet drivers 398, which operate solenoid valves and electromagnets 400 throughout the imaging station 10, 12. Solenoid valves are used to operate the various pneumatic systems of the units, such as the rodless cylinders 36, 168 and the vacuum plenums 46, 106. Servomotors include the servomotors 210, used to raise and lower the glass masters 156, 158 above the substrate 11, and the servomotor 196 used to rotate the glass master 156, 158. Electromagnets are used to form some actuators, such as the actuator 94 used to release the transport carriage 30 to move past the point it which it is stopped to receive the substrate 11 from the imaging vacuum chuck 104. Other actuators may be either pneumatic or electromechanical.

Referring additionally to FIGS. 9–12, other outputs of the DACs 396 are used to operate motor driver circuits 402, which are used to operate the motor windings extending within the insulating block 132 of each linear motor 124, 151. The linear motors 124, 151 are associated respectively with linear encoders 126, 152. The output of each of these linear encoders 126, 152 is provided as an input to the motor driver operating the associated linear motor, so that the switching of electrical current through the windings extending within its insulating block 132 is properly timed with the passage of these windings by permanent magnets 130. The output of linear encoders 126, 152 is also provided as an input to the processor 380, which derives an indication therefrom of the position of the associated carriage 112, 146. Another linear encoder 205 provides an output returned to the processor 380 to indicate rotational movement of the mask support plate 186 by means of the servomotor 196.

Other outputs of the DACs 396 are used to operate the driver circuits 404 which in turn drive piezoelectric actuators 153 used as described in reference to FIG. 8 to drive the imaging chuck 104 into a condition in which the upper surface of the substrate 11 is parallel to the lower surface of the adjacent glass master 156, 158. The results of the movements achieved with actuators 153 are measured by detectors 260 which provide inputs to logical circuits 406. These logical circuits 406 in turn provide signals indicating the width of gaps between the substrate 11 and the adjacent glass master 156, 158. These signals provide information to the processor 380, which uses this information in accordance with the subroutine previously described in reference to either FIG. 23 or FIG. 24 to control the leveling process using the piezoelectric actuators 153.

The outputs of television cameras 228 are provided as inputs to associated television circuits 408, which in turn provide inputs to the processor 380 for controlling the alignment of the substrate 11 with the glass master 156, 158, using the subroutine previously described in reference to FIG. 16.

Limit switches 410 provide additional information to the processor 380, indicating, for example that a mechanical movement has been completed or that a pneumatic pressure has been attained.

The processor 390 in the first-side imaging station 12 preferably also controls the various devices within the intermediate station 22, with some of the output signals of DACs 396 operating drivers 410 to control solenoid valves 412 within the intermediate station 22. Limit switches 414 indicate when the desired mechanical movements have been completed.

The processor 390 in the first-side imaging station 12 preferably also communicates with a similar processor 380 in the second-side imaging station 14, assuring, for example, that the movement of a substrate 11 between the imaging stations 12, 14 is properly synchronized.

A detailed description of the devices and operations of the second-side imaging station 14 is not presented here, as such devices and operations are similar of identical to the corresponding devices and operations of the first-side imaging station 12, as previously described. The modular design of the apparatus 10 allows either imaging station to be used by itself, within the scope of the present invention, if only a single side of the substrate 11 is to be imaged.

While the invention has been described in its preferred form or embodiment with some degree of particularity, it is understood that this description has been given only by way of example, and that numerous changes in the details of construction, fabrication and use, including the combination and arrangement of parts or process steps, may be made without departing from the spirit and scope of the invention.

What is claimed is:

1. Apparatus for contact exposing a first side of a substrate to illumination through a first mask and for contact exposing a second side of said substrate to illumination through a second mask, wherein said apparatus comprises:
- a first-side exposure station for exposing said first side of said substrate, including:
  - an input tray for introducing said substrate into said first-side exposure station;
  - a first transport carriage moving said substrate through said first-side exposure station in a longitudinal direction;
  - a first illumination source illuminating said first side of said substrate through said first mask in a first imaging position;
  - a first mask support plate holding said first mask in said first imaging position;
  - a first imaging carriage moving said substrate between said first transport carriage and said first imaging position; and
  - an output position to which said substrate is moved by said first transport carriage after exposure of said first side of said substrate to said first illumination source in said first imaging position;
- a second-side exposure station for exposing said second side of said substrate, including:
  - an input position for introducing said substrate into said second-side exposure station;
  - a second transport carriage moving said substrate through said second-side exposure station in a longitudinal direction;
  - a second illumination source illuminating said second side of said substrate through said second mask in a second imaging position;
  - a second mask support plate holding said second mask in said second imaging position;
  - a second imaging carriage moving said substrate between said second transport carriage and said second imaging position; and
  - an output tray to which said substrate is moved by said second transport carriage after exposure of said second side of said substrate to said second illumination source in said second imaging position; and
- an intermediate station receiving said substrate from said output position of said first-side exposure and supplying said substrate to said input position of said second-side exposure station, wherein said intermediate station includes a flipping member inverting said substrate.

2. The apparatus of claim 1, wherein
said first-side exposure station additionally includes:
- a first longitudinal drive motor moving said first imaging carriage in, and opposite to, said longitudinal direction;
- a first transverse drive motor moving said first imaging carriage in, and opposite to, a transverse direction perpendicular to said longitudinal direction, wherein said first imaging carriage is moved in said transverse direction between said first transport carriage and said first imaging position, and said second-side exposure station additionally includes:
- a second longitudinal drive motor moving said second imaging carriage in, and opposite to, said longitudinal direction;
- a second transverse drive motor moving said second imaging carriage in, and opposite to, a transverse direction perpendicular to said longitudinal direction, wherein said second imaging carriage is moved in said transverse direction between said second transport carriage and said second imaging position.

3. The apparatus of claim 2, wherein
said first-side exposure station additionally includes:
- a first position sensor detecting displacement in said first imaging position between fiducial markings on said first side of said substrate and fiducial markings on said first mask;
- first control means driving said first longitudinal and transverse drive motors in response to output signals from said first position sensor to align said fiducial markings on said first side of said substrate with said fiducial markings on said first mask, and said second-side exposure station additionally includes:
- a second position sensor detecting displacement in said second imaging position between fiducial markings on said second side of said substrate and fiducial markings on said second mask;
- second control means driving said second longitudinal and transverse drive motors in response to output signals from said second position sensor to align said fiducial markings on said second side of said substrate with said fiducial markings on said second mask.

4. The apparatus of claim 2, wherein
said first longitudinal drive motor moves said first imaging carriage in incremental distances past said imaging position,
said first transverse motor moves said first imaging carriage in incremental distances past said first imaging position and between said first imaging position and a position adjacent said first transport carriage,
said first illumination source exposes a different portion of said first side of said substrate to said first mask between various incremental movements of said first imaging carriage,
said second longitudinal drive motor moves said second imaging carriage in incremental distances past said imaging position,
said second transverse motor moves said second imaging carriage in incremental distances past said second imaging position and between said second imaging position and a position adjacent said second transport carriage, and
said second illumination source exposes a different portion of said second side of said substrate to said second mask between various incremental movements of said second imaging carriage.

5. The apparatus of claim 4, wherein
said first mask support plate additionally holds a third mask,
said first mask support plate is movable between a position in which said first mask is held in said first image position and a position in which said third mask is held in said first image position, and
said first illumination source additionally exposes said first side of said substrate to said third mask as said third mask is held in said first image position.

6. The apparatus of claim 4, wherein
said first-side exposure station additionally includes:
- a first position sensor detecting displacement in said first imaging position between fiducial markings on said first side of said substrate and fiducial markings on said third mask;
- first control means driving said first longitudinal and transverse drive motors in response to output signals from said first position sensor to align said fiducial markings on said first side of said substrate with said fiducial markings on said third mask.

7. The apparatus of claim 4, wherein said second mask support plate additionally holds a fourth mask, said second mask support plate is movable between a position in which said second mask is held in said second image position and a position in which said fourth mask is held in said second image position, and said second illumination source additionally exposes said second side of said substrate to said fourth mask as said fourth mask is held in said second image position.

8. The apparatus of claim 1, wherein each said transport carriage includes:

a vacuum plenum having a platen for carrying said substrate, a vacuum port connected to said vacuum plenum, wherein said vacuum port evacuates said vacuum plenum for engaging and carrying said substrate, and pressurizes said vacuum plenum for releasing said substrate; and an actuator moving said vacuum plenum between a retracted position, in which said transport carriage is moved in said longitudinal direction, and an extended position, in which said substrate is engaged and released.

9. The apparatus of claim 8, wherein each said imaging carriage includes a vacuum plenum, having a platen for carrying said substrate, and a vacuum port connected to said vacuum plenum, wherein said vacuum port evacuates said vacuum plenum for engaging and carrying said substrate, and pressurizes said vacuum plenum for releasing said substrate, said substrate is transferred from said first transport carriage to said first imaging carriage, with said actuator of said first transport carriage holding said substrate in contact with said platen of said first imaging carriage, by pressurizing said vacuum plenum of said first transport carriage while evacuating said vacuum plenum of said first imaging carriage, said substrate is transferred from said first imaging carriage to said first transport carriage, with said actuator of said first transport carriage holding said platen of said first transport carriage in contact with said substrate, by pressurizing said vacuum plenum of said first imaging carriage while evacuating said vacuum plenum of said first transport carriage, said substrate is transferred from said second transport carriage to said second imaging carriage, with said actuator of said second transport carriage holding said substrate in contact with said platen of said second imaging carriage, by pressurizing said vacuum plenum of said second transport carriage while evacuating said vacuum plenum of said second imaging carriage, and said substrate is transferred from said second imaging carriage to said second transport carriage, with said actuator of said second transport carriage holding said platen of said second transport carriage in contact with said substrate, by pressurizing said vacuum plenum of said second imaging carriage while evacuating said vacuum plenum of said second transport carriage.

10. Apparatus for exposing a substrate to illumination surrounding a predetermined pattern, wherein said apparatus comprises:

a mask on which said predetermined pattern is printed;

a mask support plate holding said mask;

an illumination source illuminating said substrate through said mask;

a platen holding said substrate adjacent said mask;

clamping means moving said mask and said substrate together wherein said clamping means moves adjacent surfaces of said mask and said substrate into contact with one another;

a longitudinal dive motor moving said platen in, and opposite to, a longitudinal direction;

a transverse drive motor moving said platen in, and opposite to, a transverse direction perpendicular to said longitudinal direction;

a position sensor detecting displacement between fiducial markings on said substrate and fiducial markings on said mask; and control means driving said longitudinal and transverse drive motors in response to output signals from said position sensor to align said fiducial markings on said substrate with said fiducial markings on said mask.

11. The apparatus of claim 10, wherein said position sensor includes:

a first television camera viewing first fiducial markings on said substrate and first fiducial markings on said first mask;

logic operating in response to an output of said first television camera, producing an encoded first longitudinal error signal representing a difference in placement in said longitudinal direction between a first fiducial marking on said first side of said substrate and a first fiducial marking on said first mask, and an encoded transverse error signal representing a difference in placement in said transverse direction between a first fiducial marking on said first side of said substrate and a first fiducial marking on said first mask, said control means operates said longitudinal drive motor in response to said first longitudinal error signal to reduce an absolute value of said first longitudinal error signal, and said first control means operates said first transverse drive motor in response to said transverse error signal to reduce an absolute value of said transverse error signal.

12. Apparatus for exposing a substrate to illumination surrounding a predetermined pattern, wherein said apparatus comprises:

an input tray for introducing said substrate into said apparatus;

a transport carriage moving said substrate from said input tray through said apparatus in a longitudinal direction;

a transparent mask on which said predetermined pattern is printed;

a mask support plate holding said mask;

an illumination source illuminating said substrate through said mask;

an imaging carriage moving said substrate between said transport carriage and an imaging position adjacent said mask.

13. The apparatus of claim 12, wherein said transport carriage includes:

a vacuum plenum having a platen for carrying said substrate, a vacuum port connected to said vacuum plenum, wherein said vacuum port evacuates said vacuum plenum for engaging and carrying said substrate, and pressurizes said vacuum plenum for releasing said substrate; and an actuator moving said vacuum plenum between a retracted position, in which said transport carriage is moved in said longitudinal direction, and an extended position, in which said substrate is engaged and released.

14. The apparatus of claim 13, wherein said imaging carriage includes a vacuum plenum, having a platen for carrying said substrate, and a vacuum port connected to said vacuum plenum, wherein said vacuum port evacuates said vacuum plenum for engaging and carrying said substrate, and pressurizes said vacuum plenum for releasing said substrate, said substrate is transferred from said transport carriage to said imaging carriage, with said actuator of said transport carriage holding said substrate in contact with said platen of said imaging carriage, by pressurizing said vacuum plenum of said first transport carriage while evacuating said vacuum plenum of said imaging carriage, and said substrate is transferred from said imaging carriage to said transport carriage, with said actuator of said transport carriage holding said platen of said first transport carriage in contact with said substrate, by pressurizing said vacuum plenum of said imaging carriage while evacuating said vacuum plenum of said transport carriage.

* * * * *